United States Patent
Chai

(10) Patent No.: US 11,894,066 B2
(45) Date of Patent: Feb. 6, 2024

(54) SEMICONDUCTOR MEMORY DEVICE AND METHOD OF OPERATING THE SEMICONDUCTOR MEMORY DEVICE

(71) Applicant: SK hynix Inc., Icheon-si (KR)

(72) Inventor: Soo Yeol Chai, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 232 days.

(21) Appl. No.: 17/481,927

(22) Filed: Sep. 22, 2021

(65) Prior Publication Data

US 2022/0328107 A1  Oct. 13, 2022

(30) Foreign Application Priority Data

Apr. 8, 2021  (KR) .................. 10-2021-0045947

(51) Int. Cl.
| | | |
|---|---|---|
| G11C 7/00 | (2006.01) | |
| G11C 16/26 | (2006.01) | |
| H03K 19/21 | (2006.01) | |
| G11C 16/04 | (2006.01) | |

(52) U.S. Cl.
CPC .......... *G11C 16/26* (2013.01); *G11C 16/0483* (2013.01); *H03K 19/21* (2013.01)

(58) Field of Classification Search
CPC ....... G11C 7/1051; G11C 7/1078; G11C 7/22; G11C 7/106; G11C 7/1057
USPC ........................................ 365/189.05, 189.15
See application file for complete search history.

(56) References Cited

U.S. PATENT DOCUMENTS

| | | | | |
|---|---|---|---|---|
| 2013/0132644 A1* | 5/2013 | Choi | .................. | G06F 12/0246 711/E12.008 |
| 2013/0336057 A1* | 12/2013 | Chung | .............. | G11C 16/3459 365/185.03 |
| 2018/0292989 A1* | 10/2018 | Lee | ........................ | G11C 16/32 |
| 2019/0258423 A1* | 8/2019 | Rozman | .............. | G06F 11/0727 |

FOREIGN PATENT DOCUMENTS

| | | |
|---|---|---|
| KR | 100286345 B1 | 3/2001 |
| KR | 1020130038527 A | 4/2013 |
| KR | 1020170054634 A | 5/2017 |
| KR | 102038408 B1 | 10/2019 |

* cited by examiner

*Primary Examiner* — Son T Dinh

(74) *Attorney, Agent, or Firm* — William Park & Associates Ltd.

(57) ABSTRACT

The present technology provides a method of operating a semiconductor memory device detecting a threshold voltage distribution for memory cells included in a page selected from among a plurality of memory cells. The method of operating the semiconductor memory device includes selecting a target state in which the threshold voltage distribution is to be detected, determining a plurality of read voltages for dividing a voltage range in which a threshold voltage of the selected target state is distributed, and performing a plurality of sensing operations using the plurality of read voltages on the selected page. Masking to the target state is applied in each of the plurality of sensing operations.

15 Claims, 21 Drawing Sheets

| Column | ① | ② | ③ | ④ | ⑤ | ··· | ⓜ |
|--------|-----|-----|------|------|------|-----|------|
| LSB    | 1   | 1   | 0    | 0    | 0    | ··· | 1    |
| MSB    | 0   | 1   | 0    | 1    | 0    | ··· | 1    |
| STATE  | PV1'| E'  | PV2' | PV3' | PV3' | ··· | PV1' |

| Column | ① | ② | ③ | ④ | ⑤ | ... | ⓜ |
|---|---|---|---|---|---|---|---|
| State | PV1' | E' | PV2' | PV3' | PV3' | ... | PV3' |
| 1st Sen. | 0 | 1 | 0 | 0 | 0 | ... | 0 |
| 2nd Sen. | 1 | 1 | 0 | 0 | 0 | ... | 0 |
| XOR | 0 | 1 | 0 | 0 | 0 | ... | 0 |

Data denoting memory cells between (V1–V2)

FIG. 12B

|  | E' | PV1' | PV2' | PV3' |
|---|---|---|---|---|
| LSB($Q1_N$) | 1 | 1 | 0 | 0 |
| MSB($Q2_N$) | 1 | 0 | 0 | 1 |

FIG. 12C

|  | $TRAN_A$ | $TRAN_B$ | $TRAN_C$ | $TRAN_D$ |
|---|---|---|---|---|
| E' | 1 | 0 | 1 | 0 |
| PV1' | 1 | 0 | 0 | 1 |
| PV2' | 0 | 1 | 0 | 1 |
| PV3' | 0 | 1 | 1 | 0 |

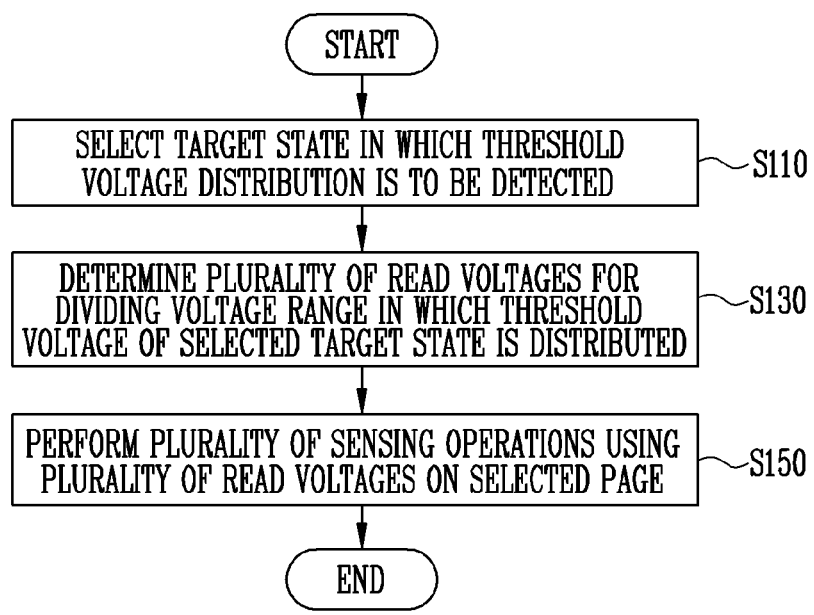

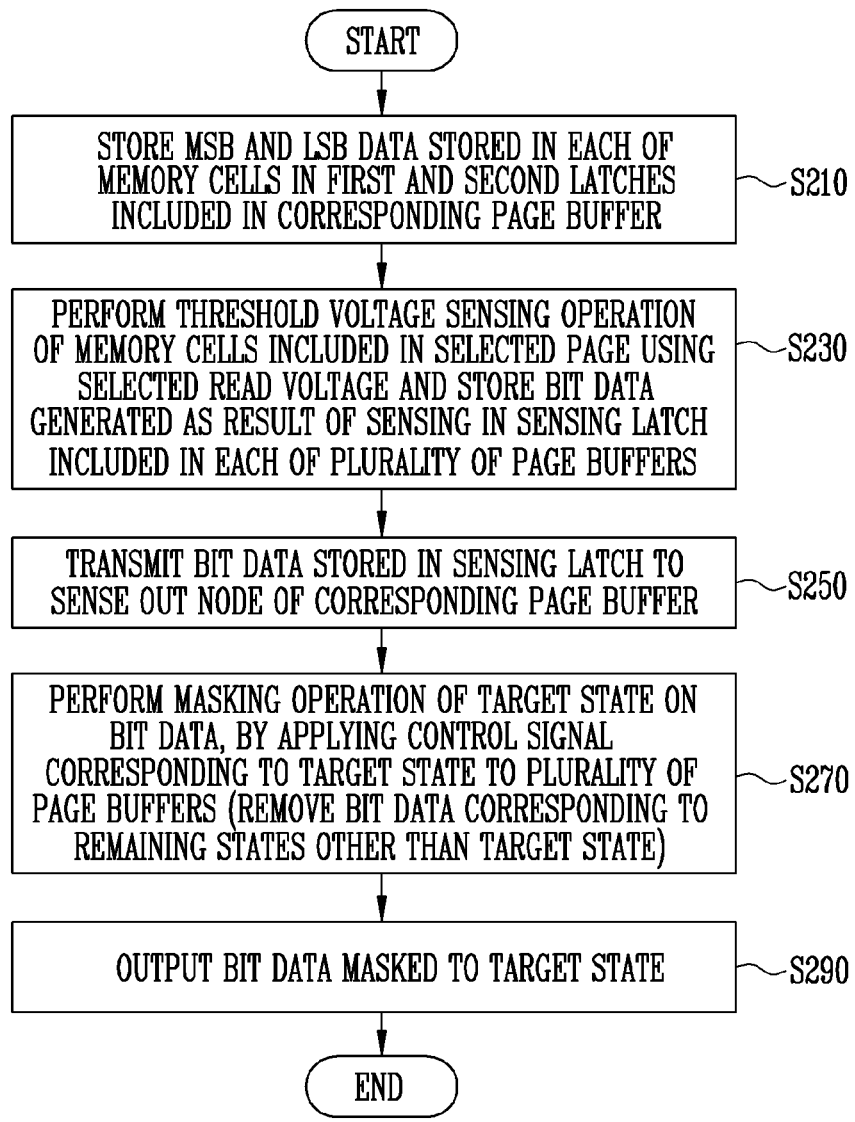

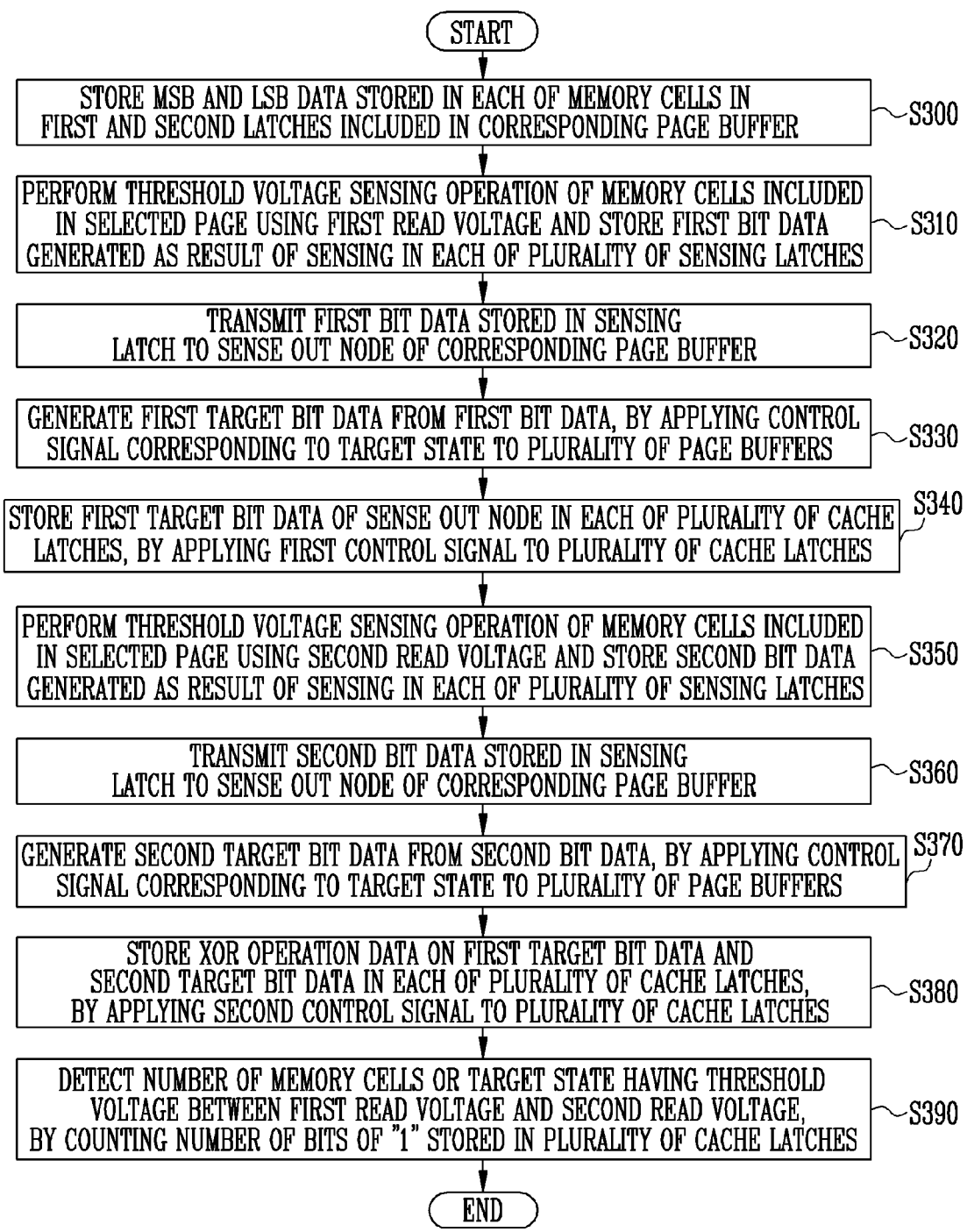

SEMICONDUCTOR MEMORY DEVICE AND METHOD OF OPERATING THE SEMICONDUCTOR MEMORY DEVICE

CROSS-REFERENCE TO RELATED APPLICATION

The present application claims priority under 35 U.S.C. § 119(a) to Korean patent application number 10-2021-0045947 filed on Apr. 8, 2021, in the Korean Intellectual Property Office, the entire disclosure of which is incorporated by reference herein.

BACKGROUND

1. Technical Field

The present disclosure relates to an electronic device, and more particularly, to a semiconductor memory device and a method of operating the semiconductor memory device.

2. Related Art

A semiconductor memory device may be formed in a two-dimensional structure in which strings are horizontally arranged on a semiconductor substrate, or may be formed in a three-dimensional structure in which the strings are vertically stacked on the semiconductor substrate. A three-dimensional semiconductor memory device is a semiconductor memory device designed to resolve a limit of an integration degree of a two-dimensional memory device, and may include a plurality of memory cells that are vertically stacked on a semiconductor substrate. Meanwhile, a controller may control an operation of the semiconductor memory device.

SUMMARY

According to an embodiment of the present disclosure, a threshold voltage distribution for memory cells included in a page selected from among a plurality of memory cells is detected by a method of operating a semiconductor memory device. The method of operating the semiconductor memory device may include selecting a target state in which the threshold voltage distribution is to be detected, determining a plurality of read voltages for dividing a voltage range in which a threshold voltage of the selected target state is distributed, and performing a plurality of sensing operations using the plurality of read voltages on the selected page. Masking to the target state may be applied in each of the plurality of sensing operations.

According to an embodiment of the present disclosure, a semiconductor memory device may include a plurality of memory cells connected to a selected word line, a plurality of page buffers configured to perform a sensing operation on each of the plurality of memory cells, and a control logic configured to control an operation of the plurality of page buffers. Each of the plurality of page buffers may include at least one data latch connected to a sense out node and storing bit data, and a sensing latch connected to the sense out node and storing bit data indicating whether a threshold voltage of a corresponding memory cell among the plurality of memory cells is greater than a selected read voltage during a sensing operation. The at least one data latch may store bit data programmed to the corresponding memory cell. The control logic may control each of the plurality of page buffers to apply masking of a target state selected as a detection target of a threshold voltage distribution to the bit data stored in the sensing latch, based on the bit data stored in the at least one data latch.

BRIEF DESCRIPTION OF THE DRAWINGS

FIG. 12B is a table illustrating bit data to be stored in a latch in the page buffer for each target state. FIG. 12C is a table illustrating transmission control signals for masking a corresponding target state for each target state.

FIG. 14 is a flowchart illustrating a method of operating a semiconductor memory device according to an embodiment of the present disclosure.

FIG. 15 is a flowchart illustrating an example of an embodiment of step S150 of FIG. 14.

FIG. 17 is a flowchart illustrating another example of an embodiment of step S150 of FIG. 14.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

An embodiment of the present disclosure provides a semiconductor memory device capable of quickly detecting a threshold voltage distribution for each state, and a method of operating the semiconductor memory device.

The present technology may provide a semiconductor memory device capable of quickly detecting a threshold voltage distribution for each state, and a method of operating the semiconductor memory device.

Figure 1:
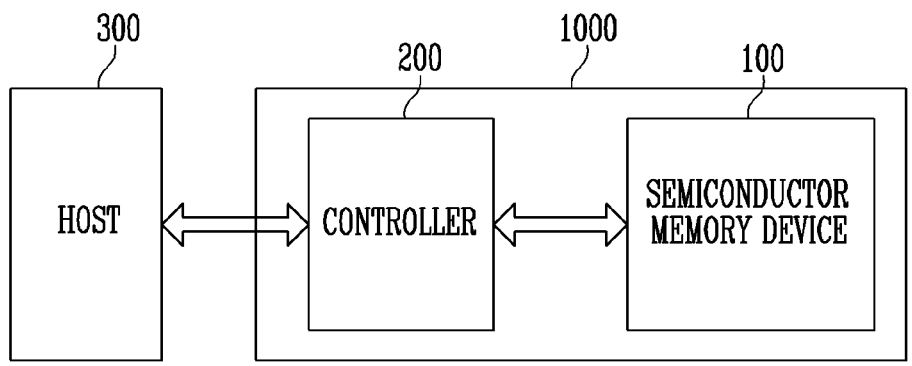
FIG. 1 is a block diagram illustrating a memory system including a semiconductor memory device and a controller according to an embodiment of the present disclosure.

FIG. 1 is a block diagram illustrating a memory system including a semiconductor memory device and a controller according to an embodiment of the present disclosure.

Referring to FIG. 1, the memory system 1000 includes the semiconductor memory device 100 and the controller 200. In addition, the memory system 1000 communicates with a host 300. The controller 200 controls an overall operation of the semiconductor memory device 100. In addition, the controller 200 controls the operation of the semiconductor memory device 100 based on a command received from the host 300.

Figure 2:
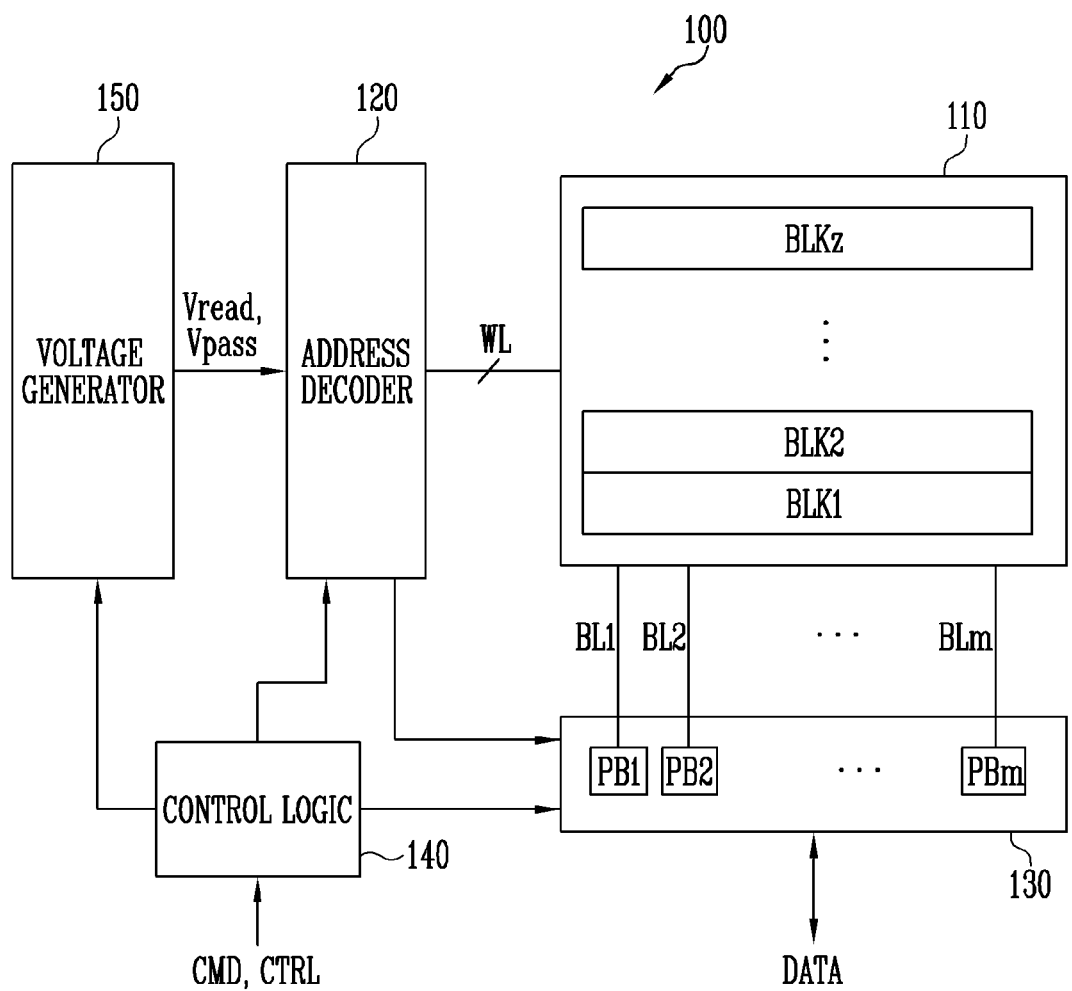
FIG. 2 is a block diagram illustrating the semiconductor memory device of FIG. 1.

FIG. 2 is a block diagram illustrating the semiconductor memory device of FIG. 1.

Referring to FIG. 2, the semiconductor memory device 100 includes a memory cell array 110, an address decoder 120, a read and write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells, and may be configured of non-volatile memory cells having a vertical channel structure. The memory cell array 110 may be configured as a memory cell array of a two-dimensional structure. According to an embodiment, the memory cell array 110 may be configured as a memory cell array of a three-dimensional structure. Meanwhile, each of the plurality of memory cells included in the memory cell array may store at least one bit of data. In an embodiment, each of the plurality of memory cells included in the memory cell array 110 may be a single-level cell (SLC) storing one bit of data. In another embodiment, each of the plurality of memory cells included in the memory cell array 110 may be a multi-level cell (MLC) storing two bits of data. In still another embodiment, each of the plurality of memory cells included in the memory cell array 110 may be a triple-level cell storing three bits of data. In still another embodiment, each of the plurality of memory cells included in the memory cell array 110 may be a quad-level cell storing four bits of data. According to an embodiment, the memory cell array 110 may include a plurality of memory cells each storing five or more bits of data.

The address decoder 120, the read and write circuit 130, and the voltage generator 150 operate as a peripheral circuit that drives the memory cell array 110. The address decoder 120 is connected to the memory cell array 110 through the word lines WL. The address decoder 120 is configured to operate in response to control of the control logic 140. The address decoder 120 receives an address through an input/output buffer (not shown) inside the semiconductor memory device 100.

The address decoder 120 is configured to decode a block address among received addresses. The address decoder 120 selects at least one memory block according to the decoded block address. In addition, the address decoder 120 applies a read voltage Vread generated by the voltage generator 150 to a selected word line among the selected memory block at a read voltage application operation during a read operation, and applies a pass voltage Vpass to the remaining unselected word lines. In addition, the address decoder 120 applies a verify voltage generated by the voltage generator 150 to the selected word line among the selected memory block and applies the pass voltage Vpass to the remaining unselected word lines during a program verify operation.

The address decoder 120 is configured to decode a column address of the received addresses. The address decoder 120 transmits the decoded column address to the read and write circuit 130.

The read operation and a program operation of the semiconductor memory device 100 are performed in a page unit. Addresses received at a time of a request of the read operation and the program operation include a block address, a row address, and a column address. The address decoder 120 selects one memory block and one word line according to the block address and the row address. The column address is decoded by the address decoder 120 and is provided to the read and write circuit 130.

The address decoder 120 may include a block decoder, a row decoder, a column decoder, an address buffer, and the like.

The read and write circuit 130 includes a plurality of page buffers PB1 to PBm. The read and write circuit 130 may operate as a "read circuit" during a read operation of the memory cell array 110 and may operate as a "write circuit" during a write operation of the memory cell array 110. The plurality of page buffers PB1 to PBm are connected to the memory cell array 110 through the bit lines BL1 to BLm. During the read operation and the program verify operation, in order to sense a threshold voltage of the memory cells, the plurality of page buffers PB1 to PBm sense a change of an amount of a current flowing according to a program state of a corresponding memory cell through a sensing node while continuously supplying a sensing current to the bit lines connected to the memory cells, and latches the sensed change as sensing data. The read and write circuit 130 operates in response to page buffer control signals output from the control logic 140.

During the read operation, the read and write circuit 130 senses data of the memory cell, temporarily stores read data, and outputs data DATA to the input/output buffer (not shown) of the semiconductor memory device 100. As an example of an embodiment, the read and write circuit 130 may include a column selection circuit, and the like, in addition to the page buffers (or page registers).

The control logic 140 is connected to the address decoder 120, the read and write circuit 130, and the voltage generator 150. The control logic 140 receives a command CMD and a control signal CTRL through the input/output buffer (not shown) of the semiconductor memory device 100. The control logic 140 is configured to control overall operations of the semiconductor memory device 100 in response to the control signal CTRL. In addition, the control logic 140 outputs a control signal for adjusting a sensing node precharge potential level of the plurality of page buffers PB1 to PBm. The control logic 140 may control the read and write circuit 130 to perform the read operation of the memory cell array 110.

The voltage generator 150 generates the read voltage Vread and the pass voltage Vpass during the read operation in response to the control signal output from the control logic 140. In order to generate a plurality of voltages having various voltage levels, the voltage generator 150 may include a plurality of pumping capacitors that receive an internal power voltage, and generate the plurality of voltages by selectively activating the plurality of pumping capacitors in response to the control of the control logic 140. As described above, the voltage generator 150 may include the charge pump, and the charge pump may include the plurality of pumping capacitors described above. A specific configuration of the charge pump included in the voltage generator 150 may be variously designed as necessary.

The address decoder 120, the read and write circuit 130, and the voltage generator 150 may function as a "peripheral circuit" that performs the read operation, the write operation, and an erase operation on the memory cell array 110. The peripheral circuit performs the read operation, the write operation, and the erase operation on the memory cell array 110 based on the control of the control logic 140.

Figure 3:
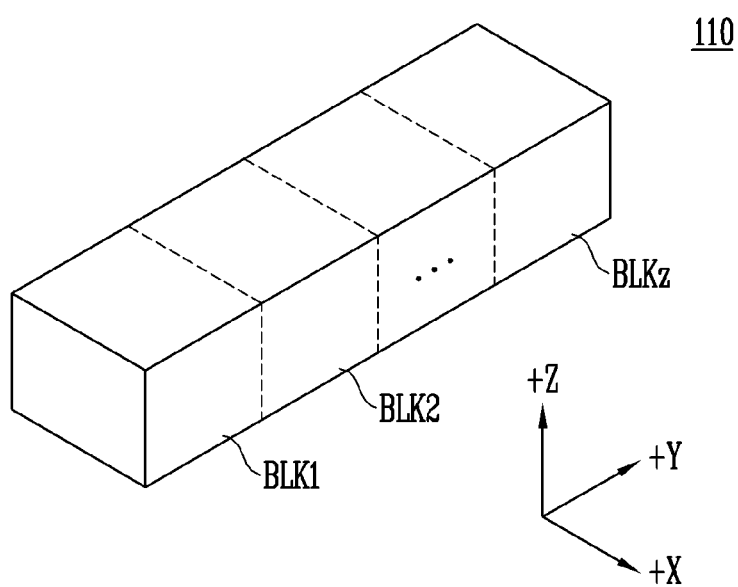
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described with reference to FIGS. 4 and 5.

Figure 4:
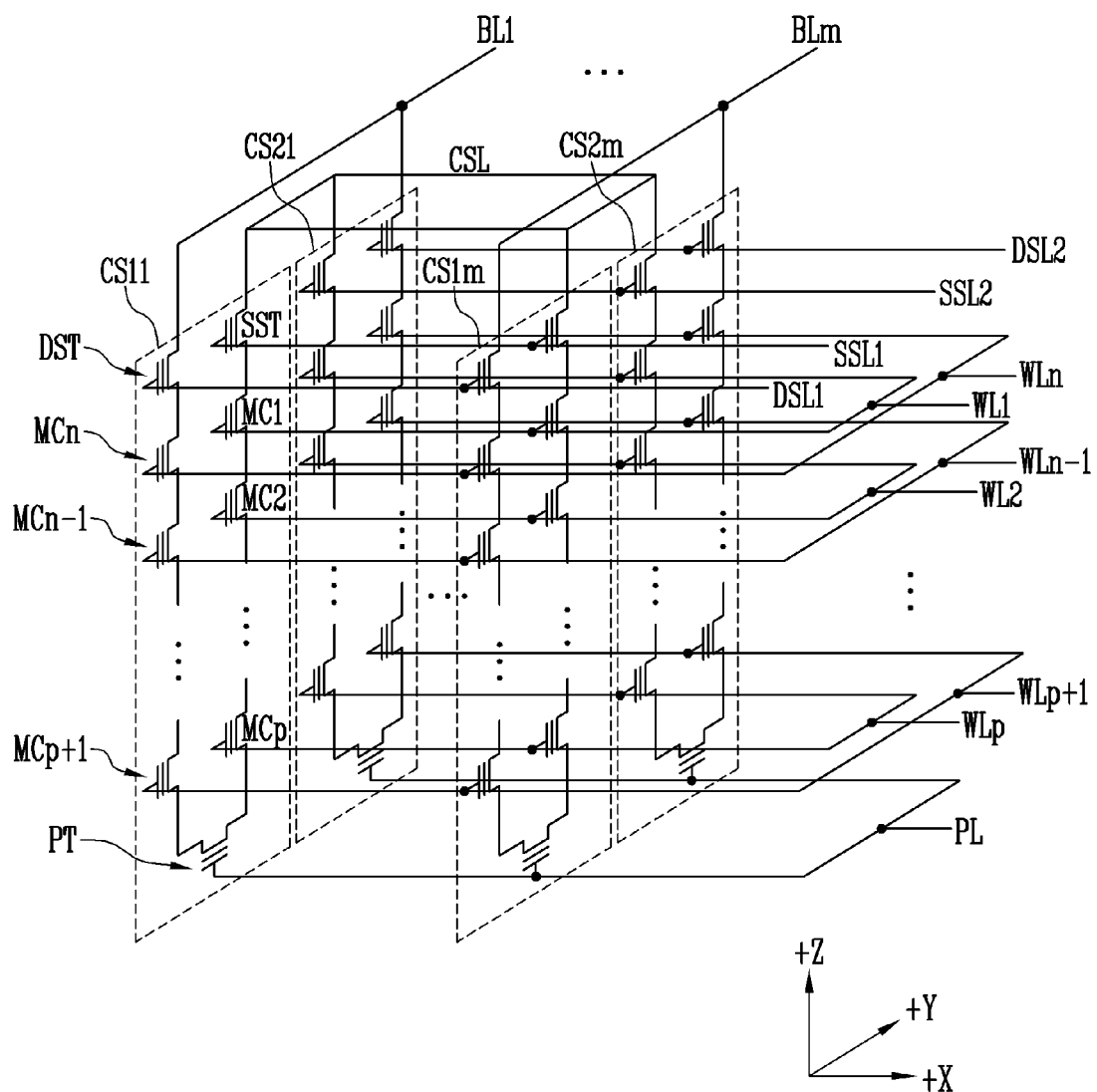
FIG. 4 is a circuit diagram illustrating any one memory block BLKa among memory blocks BLK1 to BLKz of FIG. 3.

FIG. 4 is a circuit diagram illustrating any one memory block BLKa among the memory blocks BLK1 to BLKz of FIG. 3.

Referring to FIG. 4, the memory block BLKa includes a plurality of cell strings CS11 to CS1m and CS21 to CS2m. As an embodiment, each of the plurality of cell strings CS11 to CS1m and CS21 to CS2m may be formed in a 'U' shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The drain select transistor DST of the cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to CS2m arranged in the row direction may be connected to the bit lines, respectively, and odd-numbered cell strings among the cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less dummy memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
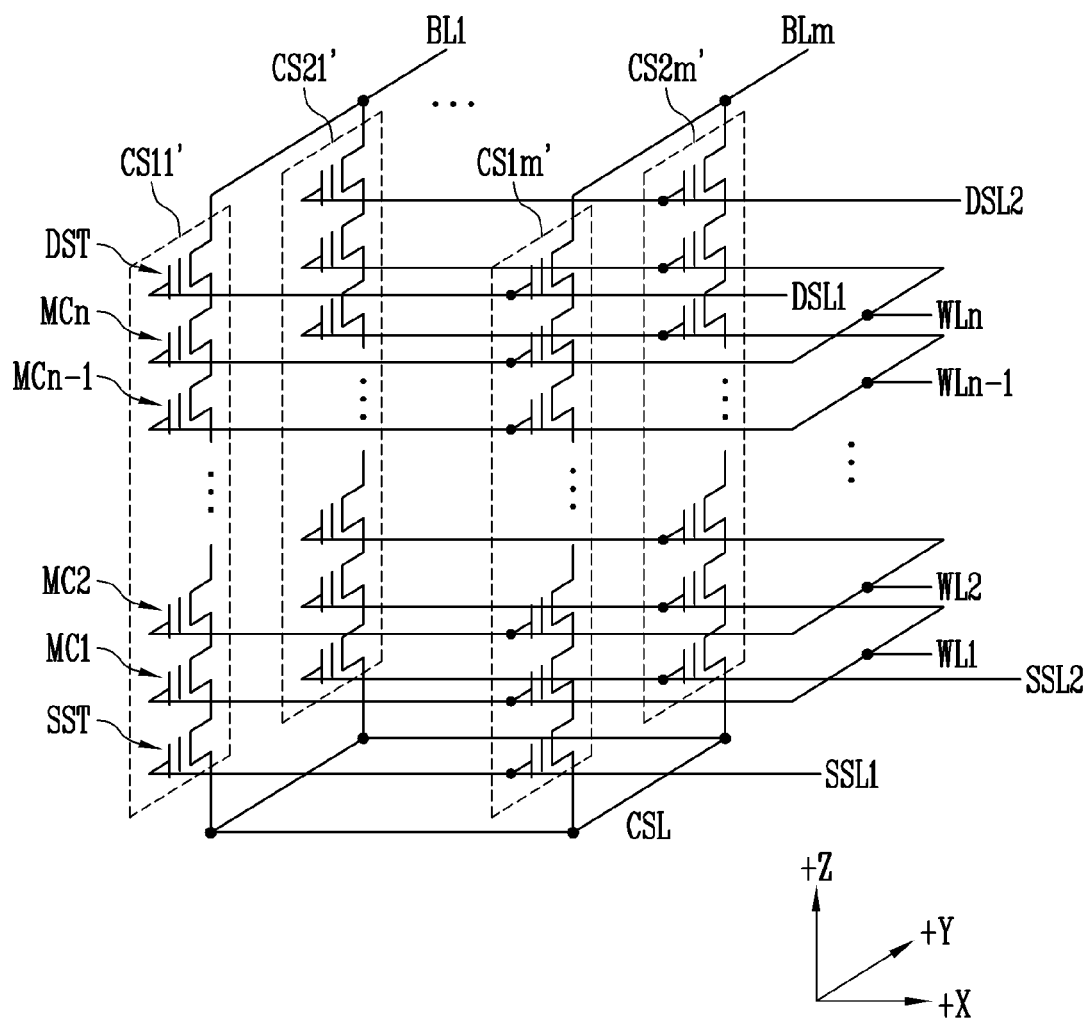
FIG. 5 is a circuit diagram illustrating another embodiment of any one memory block BLKb among the memory blocks BLK1 to BLKz of FIG. 3.

FIG. 5 is a circuit diagram illustrating another embodiment of any one memory block BLKb among the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLK1'.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, respectively, and odd-numbered cell strings among the cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
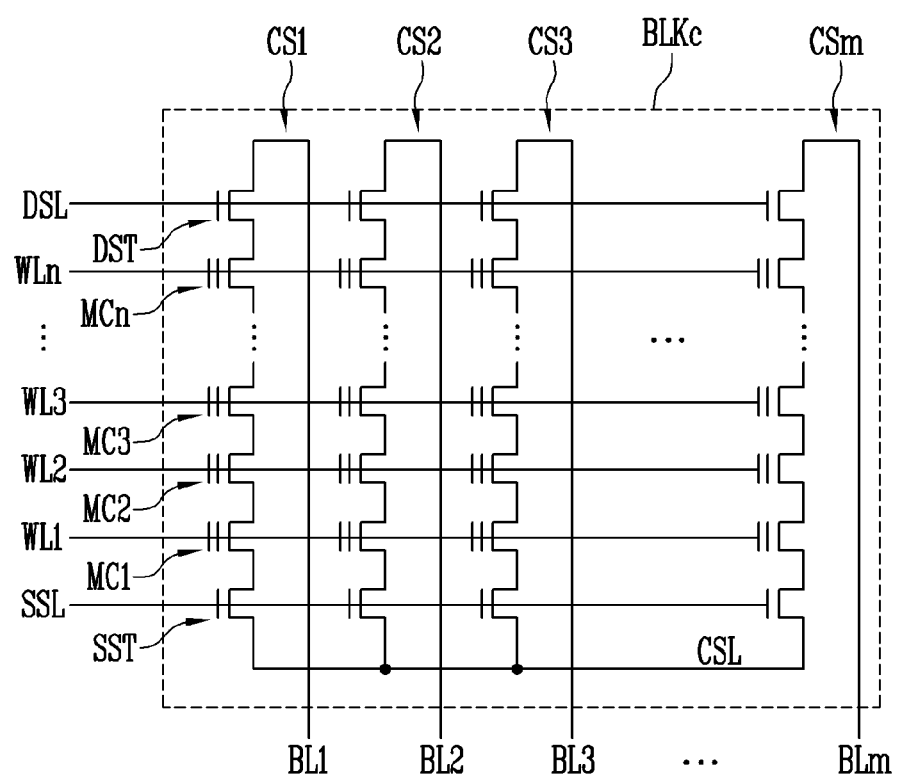
FIG. 6 is a circuit diagram illustrating an embodiment of any one memory block BLKc among the plurality of memory blocks BLK1 to BLKz included in the memory cell array of FIG. 2.

FIG. 6 is a circuit diagram illustrating an embodiment of any one memory block BLKc among the plurality of memory blocks BLK1 to BLKz included in the memory cell array 110 of FIG. 2.

Referring to FIG. 6, the memory block BLKc includes a plurality of cell strings CS1 to CSm. The plurality of cell strings CS1 to CSm may be connected to a plurality of bit lines BL1 to BLm, respectively. Each of the cell strings CS1 to CSm includes at least one source select transistor SST, first to n-th memory cells MC1 to MCn, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCn.

The first to n-th memory cells MC1 to MCn of each cell string are connected between the source select transistor SST and the drain select transistor DST.

The drain select transistor DST of each cell string is connected between a corresponding bit line and the memory cells MC1 to MCn.

Memory cells connected to the same word line configure one page. The cell strings CS1 to CSm may be selected by selecting the drain select line DSL. One page among the selected cell strings may be selected by selecting any one of the word lines WL1 to WLn.

As another embodiment, even bit lines and odd bit lines may be provided instead of the first to m-th bit lines BL1 to BLm. Even-numbered cell strings among the cell strings CS1 to CSm may be connected to even bit lines, respectively, and odd-numbered cell strings may be connected to odd bit lines, respectively.

Figure 7:
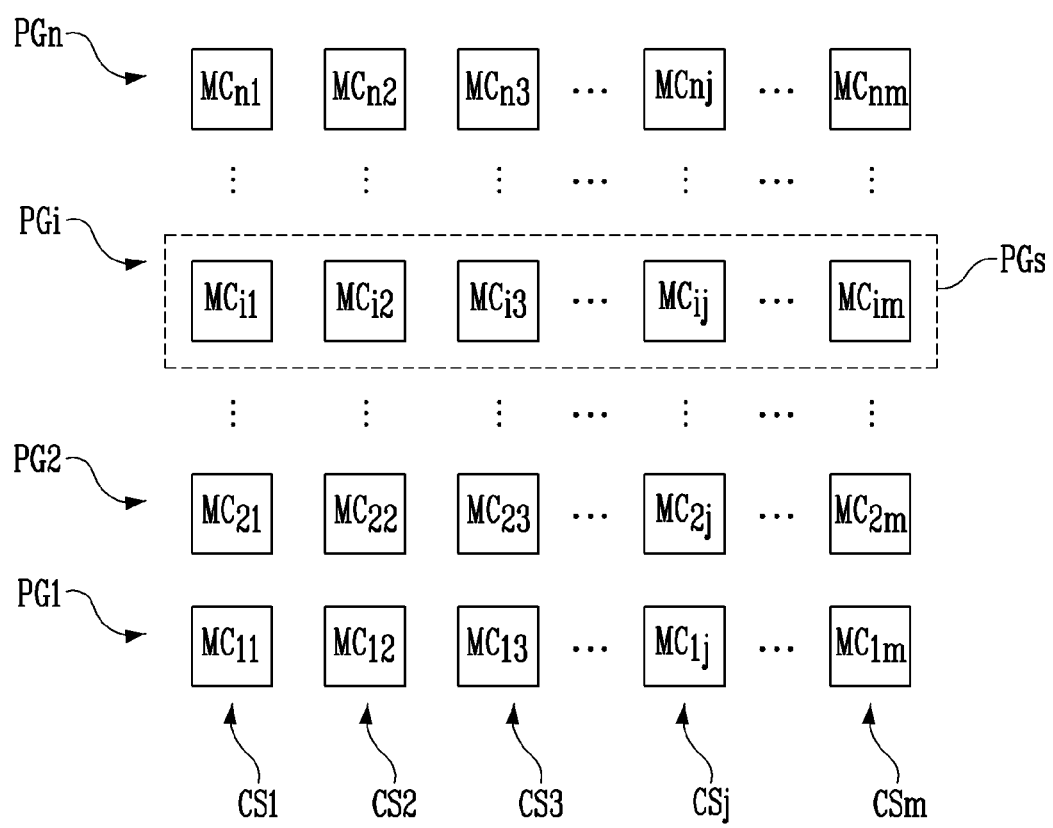
FIG. 7 is a diagram illustrating a page and a cell string formed by memory cells included in the memory cell array.

FIG. 7 is a diagram illustrating the page and the cell string formed by the memory cells included in the memory cell array.

Referring to FIG. 7, the memory block includes first to m-th cell strings CS1 to CSm. The first cell string CS1 includes n memory cells $MC_{11}$ to $MC_{n1}$. The second cell string CS2 also includes n memory cells $MC_{12}$ to $MC_{n2}$. In such a method, the m-th cell string CSm may include n memory cells $MC_{1m}$ to $MC_{nm}$.

Meanwhile, a first page PG1 includes m memory cells $MC_{11}$ to $MC_{1m}$. A second page PG2 also includes m memory cells $MC_{21}$ to $MC_{2m}$. In such a method, an n-th page PGn includes m memory cells $MC_{n1}$ to $MC_{nm}$.

The read operation of the semiconductor memory device 100 may be performed in a page unit. Therefore, any one of first to n-th pages may be selected as a read target. In an example of FIG. 7, an i-th page PGi may be a selected page PGs which is the read target. The i-th page PGi includes first to m-th memory cells $MC_{i1}$ to $MC_{im}$.

Figure 8:
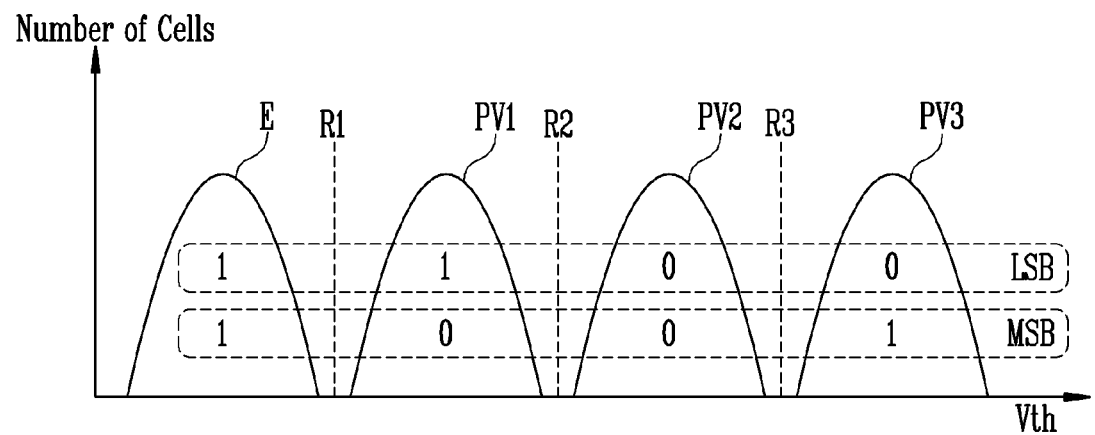
FIG. 8 is a graph illustrating a threshold voltage distribution of a multi-level cell (MLC).

FIG. 8 is a graph illustrating a threshold voltage distribution Vth of the MLC. In particular, FIG. 8 shows the threshold voltage distribution immediately after the program operation is completed on the selected page PGs. Each of the MLCs storing two bits of data for each memory cell may be programmed to any one of four states according to bit data to be stored.

FIG. 8 shows an embodiment in which the four states are mapped according to an example of a logic code. Referring to FIG. 8, a memory cell of which a least significant bit (LSB) is 1 and a most significant bit (MSB) is 1 maintains an erase state E. A memory cell of which an LSB is 1 and an MSB is 0 is programmed to a first program state PV1. A memory cell of which an LSB is 0 and an MSB is 0 is programmed to a second program state PV2. A memory cell of which an LSB is 0 and an MSB is 1 is programmed to a third program state PV3. That is, in the logical code shown in FIG. 8, data of "1 1" is mapped to the erase state E, data of "1 0" is mapped to the first program state PV1, data of "0 0" is mapped to the second program state PV2, and data of "0 1" is mapped to the third program state PV3, based on an LSB-MSB order. However, this is exemplary, and various logic codes different from that shown in FIG. 8 may be used.

A typical read operation may be performed to read data stored in the memory cells. In this case, data programmed to the memory cells included in the selected page may be read, by using a first read voltage R1, a second read voltage R2, and a third read voltage R3.

As another example, a read operation for detecting the threshold voltage distribution of the memory cells included in the selected page may be performed. As described above, FIG. 8 shows the threshold voltage distribution of the memory cells immediately after the program operation. However, after the program operation is performed on the selected page PGs, the threshold voltage distribution of the memory cells may be changed due to various causes. In many cases, such a changed threshold voltage distribution is required to be detected. For example, in a test operation on the semiconductor memory device 100, the changed threshold voltage distribution of the memory cells may be detected and analyzed. To this end, a sensing operation with a voltage of various magnitudes is required to be repeatedly performed on the selected page.

In the present specification, the read operation is used as a meaning of an operation of reading the data stored in the memory cells. In addition, in the present specification, the sensing operation is used as a meaning of an operation of determining whether a threshold voltage of the memory cells is greater than a specific sensing voltage. However, since there is no significant difference between the read operation and the sensing operation in an actual operation, they are used interchangeably in the present specification. More specifically, in the case of the SLC, the operation of reading data may be configured of a single sensing operation. In the case of the MLC, in order to read both of LSB data and MSB data, three sensing operations using the first read voltage R1, the second read voltage R2, and the third read voltage R3 may be required. That is, according to an embodiment, the read operation on the selected page may include at least one sensing operation.

Figure 9A:
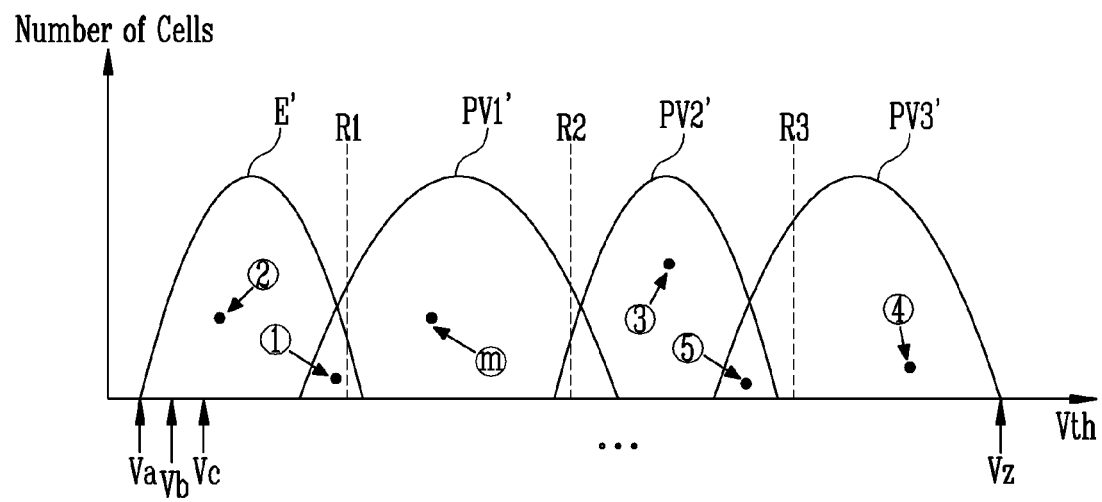
FIG. 9A is a graph illustrating a state in which the threshold voltage distribution of the MLC is changed.
Figures 9B, 10A:
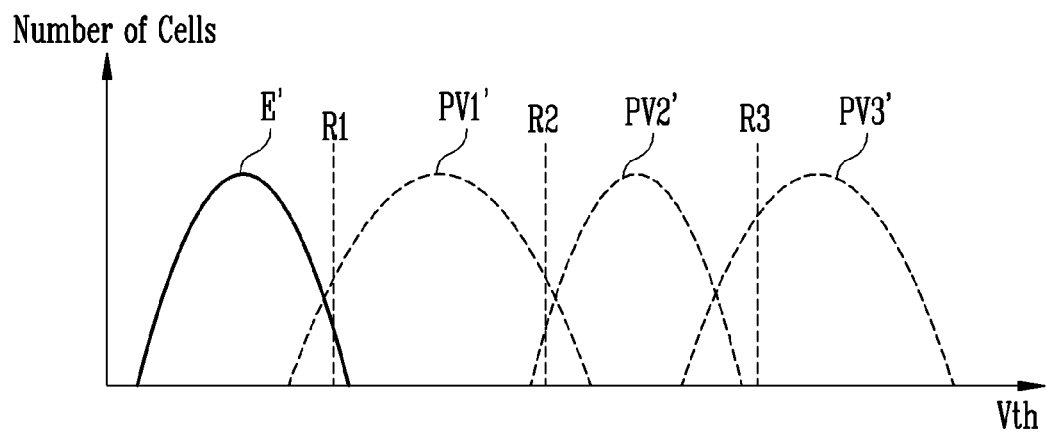
FIG. 9B is a table illustrating a threshold voltage of a memory cell corresponding to each column of a selected page.
FIG. 10A is a graph illustrating a threshold voltage distribution corresponding to an erase state E' among detected threshold voltage distributions.

FIG. 9A is a graph illustrating a state in which the threshold voltage distribution of the MLC is changed. FIG. 9B is a table illustrating the threshold voltage of the memory cell corresponding to each column of the selected page.

In FIG. 8, the threshold voltage distribution including the erase state E and the first to third program states P1 to P3 immediately after the program operation is shown. Referring to FIG. 9A, compared to FIG. 8, it may be seen that the threshold voltage distribution is changed. FIG. 9A illustrates the threshold voltage distribution including a changed erase state E' and first to third program states PV1' to PV3'.

FIG. 9A shows the changed threshold voltage distribution of the memory cells included in the selected page, for example, the selected page PGs shown in FIG. 7. That is, FIG. 9A shows the threshold voltage distributions of the first to m-th memory cells MCi1 to MCim included in the selected page PGs of FIG. 7. For example, a position indicating the threshold voltage of the first memory cell MCi1 is indicated as ①. In addition, a position indicating the threshold voltage of the second memory cell MCi2 is indicated as ②. In such a method, positions indicating the threshold voltages of the third memory cell MCi3, the fourth memory cell MCi4, and the fifth memory cell MCi5 may be indicated as ③, ④, and ⑤, respectively. In such a method, a position indicating the threshold voltage of the m-th memory cell MCim may also be indicated by ⓜ.

With respect to the selected page PGs, the threshold voltage distribution of the memory cells may be detected through a plurality of sensing operations using a plurality of different sensing voltages. As shown in FIG. 9A, a form of the threshold voltage distribution of the memory cells belonging to the selected page PGs may be detected, through a plurality of sensing operations through a plurality of sensing voltages Va, Vb, Vc, . . . , and Vz.

However, in this case, it is not possible to distinguish which state the threshold voltage of the memory cell positioned near a boundary of a plurality of states belongs. For example, according to that shown in FIG. 9A, it might not be determined whether the first memory cell MCi1 positioned at ① is a memory cell belonging to the erase state E' or a memory cell belonging to the first program state PV1'.

As described above, in order to grasp a change aspect of the threshold voltage distribution for each state, after detecting the threshold voltage distribution of the memory cells belonging to the selected page, it is necessary to match the threshold voltage distribution with the data originally stored in the memory cells. In a typical case, a test device or the controller 200 programs data to the selected page of the semiconductor memory device 100. The test device or the controller 200 maintains the data. Thereafter, the test device or the controller 200 controls the semiconductor memory device 100 to perform the plurality of sensing operations through the plurality of sensing voltages Va, Vb, Vc, . . . , and Vz. According to the plurality of sensing operations, the test device or the controller 200 may obtain data on the entire threshold voltage distribution in which states are not divided. The test device or the controller 200 may extract the threshold voltage distribution for each state by matching the obtained data on the threshold voltage distribution with the data maintained therein.

That is, the test device or the controller 200 may maintain data as shown in FIG. 9B. Referring to FIG. 9B, LSB data and MSB data corresponding to each of the first to m-th memory cells MCi1 to MCim of the selected page are shown. The threshold voltage of the memory cell corresponding to a column ① is detected at the position of ①shown in FIG. 9A. Meanwhile, test data originally stored in the memory cell corresponding to the column ① has the LSB of 1 and the MSB of 0, which corresponds to the first program state PV1'. As described above, the test device or the controller 200 may distinguish that the threshold voltage of the first memory cell MCi1 corresponding to the position of ①shown in FIG. 9A is the first program state PV1' not the erase state E', through the data maintained therein.

Figure 10B:
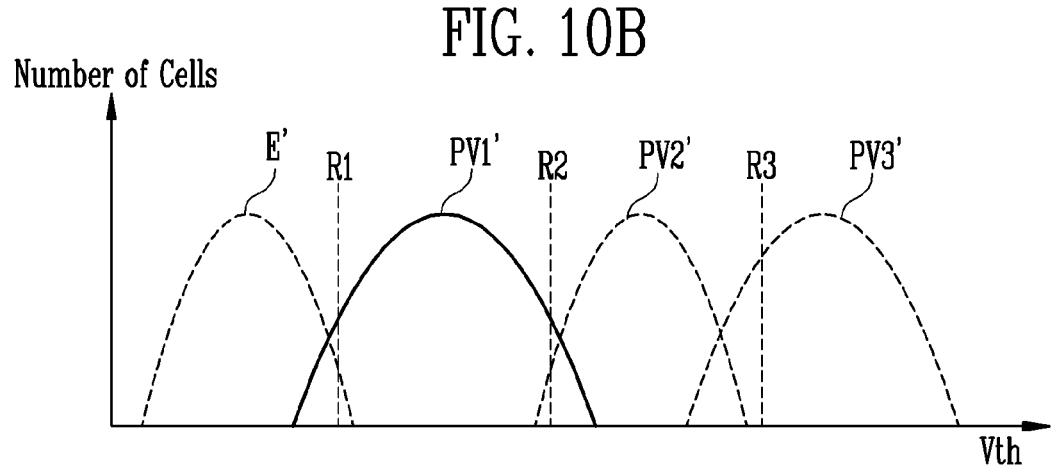
FIG. 10B is a graph illustrating a threshold voltage distribution corresponding to a first program state PV1' among the detected threshold voltage distributions.
Figure 10C:
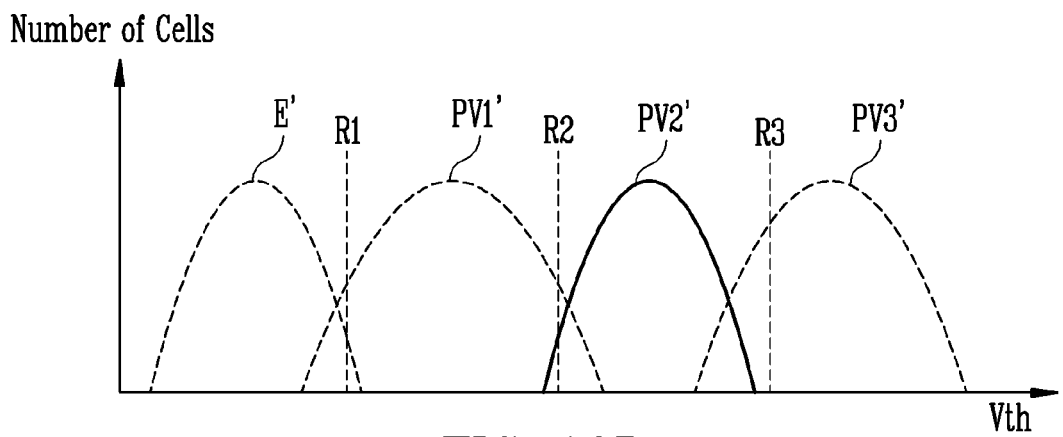
FIG. 10C is a graph illustrating a threshold voltage distribution corresponding to a second program state PV2' among the detected threshold voltage distributions.
Figure 10D:
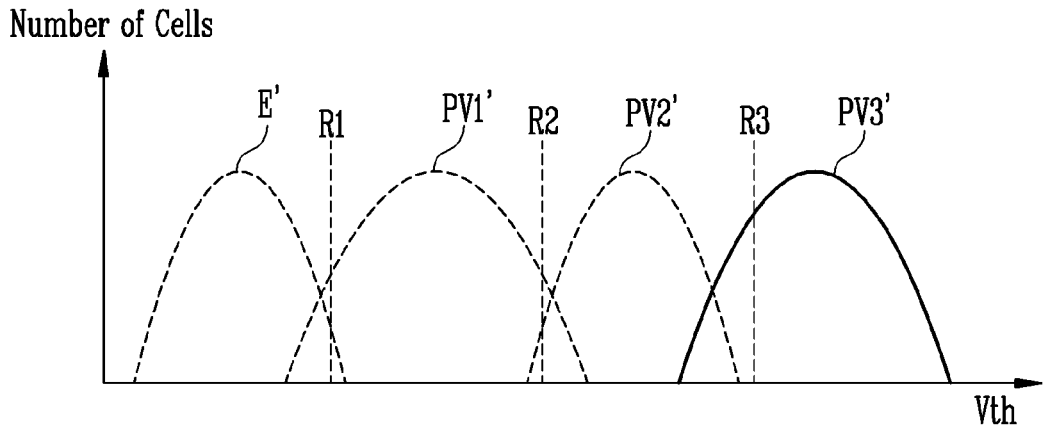
FIG. 10D is a graph illustrating a threshold voltage distribution corresponding to the third program state PV3' among the detected threshold voltage distributions.

FIG. 10A is a graph illustrating the threshold voltage distribution corresponding to the erase state E' among the detected threshold voltage distributions. FIG. 10B is a graph illustrating the threshold voltage distribution corresponding to the first program state PV1' among the detected threshold voltage distributions. FIG. 10C is a graph illustrating the threshold voltage distribution corresponding to the second program state PV2' among the detected threshold voltage distributions. FIG. 10D is a graph illustrating the threshold voltage distribution corresponding to the third program state PV3' among the detected threshold voltage distributions.

As described above, the threshold voltage distribution for each state may be extracted by matching original data as a table shown in FIG. 9B to the threshold voltage distribution data obtained by performing the plurality of sensing operations through the plurality of sensing voltages Va, Vb, Vc, . . . , and Vz. For example, among the obtained threshold voltage distribution data, when only data corresponding to the columns (including ②) of which the LSB is 1 and the MSB is 1 is extracted from the columns shown in the table shown in FIG. 9B, the threshold voltage distribution data indicating only the erase state E' may be obtained as shown in FIG. 10A. In a similar method, among the obtained threshold voltage distribution data, when only data corresponding to the columns (including ① and ⓜ) of which the LSB is 1 and the MSB is 0 is extracted from the columns shown in the table shown in FIG. 9B, the threshold voltage distribution data indicating only the first program state PV1' may be obtained as shown in FIG. 10B. In addition, among the obtained threshold voltage distribution data, when only data corresponding to the columns (including ③) of which the LSB is 0 and the MSB is 0 is extracted from the columns shown in the table shown in FIG. 9B, the threshold voltage distribution data indicating only the second program state PV2' may be obtained as shown in FIG. 10C. Finally, the obtained threshold voltage distribution data, when only data corresponding to the columns (including ④ and ⑤) of which the LSB is 0 and the MSB is 1 is extracted from the columns shown in the table shown in FIG. 9B, the threshold voltage distribution data indicating only the third program state PV3' may be obtained as shown in FIG. 10D.

However, according to the above-described method, all sensing results obtained by performing the plurality of sensing operations through the plurality of sensing voltages Va, Vb, Vc, . . . , and Vz are required to output to the controller 200 or the test device. According such a method, it takes a lot of time to output data generated as a result of the plurality of sensing operations to the controller 200 or the test device and to compare the data with the original data. In particular, when outputting the result data of the plurality of sensing operations to test equipment that might not output high-speed data, it takes a long time to calculate the threshold voltage distribution for each program state.

In accordance with the semiconductor memory device according to an embodiment of the present disclosure, a sensing result is output by storing the original data in the latch circuit included in the plurality of page buffers and masking the target state for each of the plurality of sensing operations. Accordingly, an operation of detecting the threshold voltage distribution for each of the plurality of states may be quickly performed.

Figures 11A, 11B:
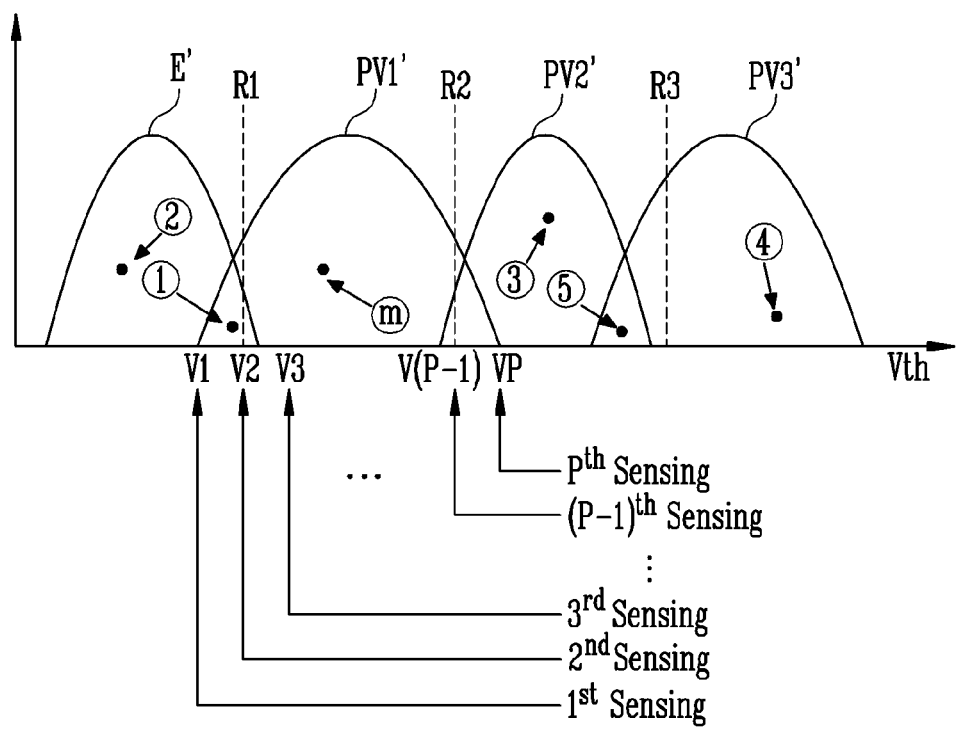
FIG. 11A is a graph illustrating a detection operation of the threshold voltage distribution when the first program state PV1' is a target state.
FIG. 11B is a table illustrating a method of deriving the threshold voltage distribution within each voltage section based on a result of a plurality of sensing operations.

FIG. 11A is a graph illustrating a detection operation of the threshold voltage distribution when the first program state PV1' is the target state. FIG. 11B is a table illustrating a method of deriving the threshold voltage distribution within each voltage section based on a result of the plurality of sensing operations.

Referring to FIG. 11A, when the first program state PV1' is the target state, approximately first to P-th voltages V1 to VP may be determined as a sensing voltage. However, this is an example, and when a distribution of the first program state PV1' is expected to be wider than that of FIG. 11A, a magnitude of the first voltage V1 may be further decreased and a magnitude of the P-th voltage VP may be further increased. Conversely, when the distribution of the first program state PV1' is expected to be narrower than that of FIG. 11A, the first voltage V1 may be further increased and the P-th voltage VP may be further decreased.

Alternatively, when the distribution of the first program state PV1' is expected to be skewed to right than that of FIG. 11A, the magnitudes of the first voltage V1 and the P-th voltage VP may be further increased.

A sensing operation using P sensing voltages may be performed. The number P may be determined variously as needed. When a size of P is large, the threshold voltage distribution may be detected with a higher resolution, but a detection time is increased. When the size of P is small, the detection time may be decreased, but the resolution of the threshold voltage distribution is decreased.

Referring to FIG. 11B, first, a method of detecting memory cells having a threshold voltage between a section V1 to V2 as a result of the sensing operation through the first voltage V1 and the second voltage V2 is described.

When performing a sensing operation $1^{st}$ SEN. through the first voltage V1, a detection value for the memory cell of which a threshold voltage is lower than the first voltage V1 becomes 1, and a detection value for the memory cell of which a threshold voltage is higher than the first voltage V1 becomes 0. In an example of FIG. 11B, since the threshold voltage of the memory cell corresponding to column ② is lower than the first voltage V1, the result value of the first sensing $1^{st}$ SEN. corresponding to the column ② becomes 1. Meanwhile, since the threshold voltage of the memory cells corresponding to the column ①, the column ③, the column ④, the column ⑤, and the column ⑩ is higher than the first voltage V1, the result value of the first sensing $1^{st}$ SEN. corresponding to the column ①, the column ③, the column ④, the column ⑤, and the column ⑩ becomes 0.

Meanwhile, when performing a sensing operation $2^{nd}$ SEN. through the second voltage V2, a detection value for the memory cell of which a threshold voltage is lower than the second voltage V2 becomes 1, and a detection value for a memory cell of which a threshold voltage is higher than the second voltage V2 becomes 0. In an example of FIG. 11B, since the threshold voltage of the memory cell corresponding to the columns ① and ② is lower than the second voltage V2, a result value of the second sensing $2^{nd}$ SEN. corresponding to the columns ① and ② becomes 1. Meanwhile, since the threshold voltage of the memory cells corresponding to the column ③, the column ④, the column ⑤, and the column ⑩ is higher than the second voltage V2, a result value of the second sensing $2^{nd}$ SEN. corresponding to the column ③, the column ④, the column ⑤, and the column ⑩ becomes 0.

The threshold voltage of the memory cell between the sections V1 to V2 is greater than the first voltage V1 and less than the second voltage V2. That is, an exclusive-OR (XOR) operation is performed on the result value of the first sensing $1^{st}$ SEN. using the first voltage V1 and the second sensing $2^{nd}$ SEN. using the second voltage V2, a value of the column corresponding to the memory cells having the threshold voltage between the sections V1 to V2 becomes 1, and a value of the column corresponding to the memory cells having the threshold voltage of a remaining section becomes 0.

In order to detect a memory cell having a threshold voltage belonging to sections V2 to V3, the sensing operation using the third voltage V3 is performed, and an XOR operation is performed on a result of the sensing operation and the second sensing $2^{nd}$ SEN.

When the sensing operation using the first voltage V1 and the second voltage V2 is performed, the number of memory cells having the threshold voltage between the sections V1 to V2 among all memory cells belonging to the selected page may be detected. However, in this case, the memory cells belonging to the erase state E' may also be included in the memory cells having the threshold voltage between the sections V1 to V2. Therefore, in order to detect a distribution of only the memory cells corresponding to the first program state PV1', a sensing operation applying masking for the first program state PV1' is required. Hereinafter, a sensing operation applying masking to the target state is described with reference to FIGS. 12A, 12B, and 12C.

Figure 12A:
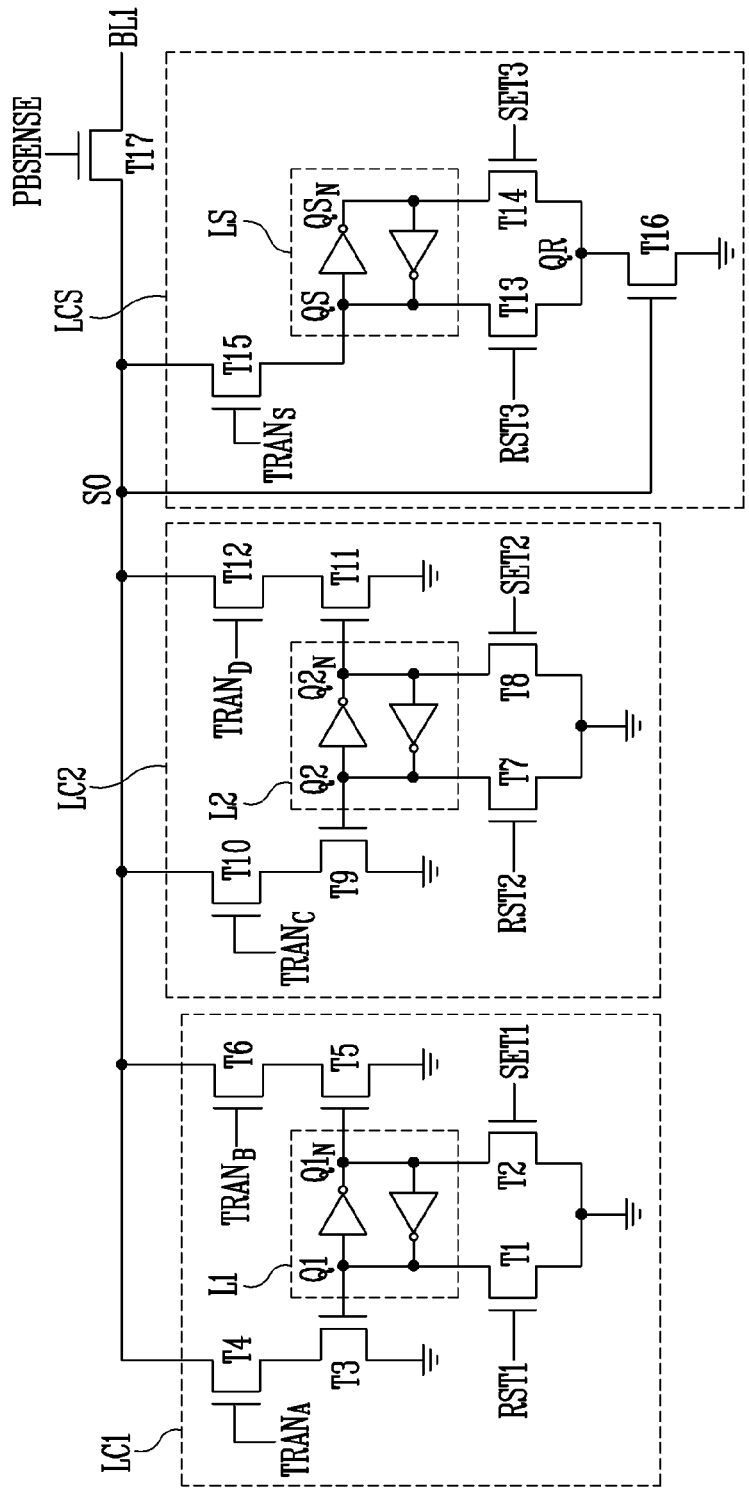
FIG. 12A is a circuit diagram illustrating a page buffer capable of detecting the threshold voltage distribution of the MLCs by masking for each target state, according to an embodiment of the present disclosure.

FIG. 12A is a circuit diagram illustrating a page buffer capable of detecting the threshold voltage distribution of the MLCs by masking for each target state, according to an embodiment of the present disclosure. FIG. 12B is a table illustrating bit data to be stored in the latch in the page buffer for each target state. FIG. 12C is a table illustrating transmission control signals for masking a corresponding target state for each target state.

Referring to FIG. 12A, a circuit diagram of an example of a page buffer is shown. The first to m-th page buffers PB1 to PBm shown in FIG. 2 may be implemented as a circuit shown in FIG. 12A. The first to m-th page buffers PB1 to PBm shown in FIG. 2 may further include other components in addition to the circuit shown in FIG. 12A. Hereinafter, a description is given based on the page buffer PB1 connected to the first bit line BL1.

The page buffer may include a first latch circuit LC1, a second latch circuit LC2, and a sensing latch circuit LCS. The first latch circuit LC1 may include a first latch L1 and first to sixth transistors T1 to T6. The second latch circuit LC2 may include a second latch L2 and seventh to twelfth transistors T7 to T12. The sensing latch circuit LCS may include a sensing latch LS and thirteenth to sixteenth transistors T13 to T16. The first latch circuit LC1, the second latch circuit LC2, and the sensing latch circuit LCS may be connected to a sense out node SO. Meanwhile, the page buffer may further include a seventeenth transistor T17 connected between the sense out node SO and the bit line BL1. The seventeenth transistor T17 may be controlled by a page buffer sensing signal PBSENSE. In the present specification, the seventeenth transistor T17 may be referred to as a "page buffer sensing transistor".

Referring to the first latch circuit LC1, the first transistor T1 is connected between a node Q1 of the first latch L1 and a ground, and the second transistor T2 is connected between a node $Q1_N$ of the first latch L1 and the ground. The first transistor T1 is controlled by a first reset signal RST1, and the second transistor T2 is controlled by a first set signal SET1. Meanwhile, the third and fourth transistors T3 and T4 are sequentially connected between a ground node and the sense out node SO. The third transistor T3 is controlled by a voltage of the node Q1 of the first latch L1, and the fourth transistor T4 is controlled by a first transmission control signal $TRAN_A$. In addition, the fifth and sixth transistors T5 and T6 are sequentially connected between the ground node and the sense out node SO. The fifth transistor T5 is controlled by a voltage of the node $Q1_N$ of the first latch L1, the fourth transistor T4 is controlled by a second transmission control signal $TRAN_B$.

Referring to the second latch circuit LC2, the seventh transistor T7 is connected between a node Q2 of the second latch L2 and the ground, and the eighth transistor T8 is connected between a node $Q2_N$ of the second latch L2 and the ground. The seventh transistor T7 is controlled by a second reset signal RST2, and the eighth transistor T8 is controlled by a second set signal SET2. Meanwhile, the ninth and tenth transistors T9 and T10 are sequentially connected between the ground node and the sense out node SO. The ninth transistor T9 is controlled by a voltage of the node 02 of the second latch L2, and the tenth transistor T10 is controlled by a third transmission control signal $TRAN_C$. In addition, the eleventh and twelfth transistors T11 and T12 are sequentially connected between the ground node and the sense out node SO. The eleventh transistor T11 is controlled by a voltage of the node $Q2_N$ of the second latch L2, and the twelfth transistor T12 is controlled by a fourth transmission control signal $TRAN_D$.

Referring to the sensing latch circuit LCS, the thirteenth transistor T13 is connected between the node QS of the sensing latch LS and a node QR, and the fourteenth transistor T14 is connected between a node $QS_N$ and the node QR. The thirteenth transistor T13 is controlled by a third reset signal RST3, and the fourteenth transistor T14 is controlled by a third set signal SET3. Meanwhile, the fifteenth transistor T15 is connected between the node QS and the sense out node SO. The fifteenth transistor T15 is controlled by a sensing transmission control signal $TRAN_S$. In addition, the sixteenth transistor T16 is connected between the node QR and the ground node. The sixteenth transistor T16 is controlled by a voltage of the sense out node SO.

All control signals applied to the page buffer may be received from the control logic 140.

First, for masking for each state, the controller 200 or the test device may transmit the original data stored in the selected page PGs to the semiconductor memory device 100.

The semiconductor memory device 100 stores the received original data in the plurality of page buffers.

More specifically, among the original data, data stored in the first memory cell MCi1 is stored in the first latch L1 and the second latch L2 of the page buffer connected to the first bit line BL1. The first latch L1 and the second latch L2 may be referred to as a "data latch". In the case of the MLC, since two bit data is stored in one memory cell, a page buffer corresponding thereto is required to also store two bit data. In an embodiment, the LSB may be stored in the first latch L1 of the page buffer, and the MSB may be stored in the second latch L2.

In the above-described example of FIGS. 9A, 9B, 11A, and 11B, in a case of the column ① corresponding to the first memory cell MCi1, the LSB is 1 and the MSB is 0. Therefore, bit data of 1 may be stored in the first latch L1 of FIG. 12A and bit data of 0 may be stored in the second latch L2. As the bit data of 1 is stored in the first latch L1, the voltage of the node $Q1_N$ may be a logic-high voltage corresponding to a bit value of "1", and the voltage of the node Q1 may be a logic-low voltage corresponding to a bit value of "0". As the bit data of 0 is stored in the second latch L2, the voltage of the node $Q2_N$ may be a logic-low voltage corresponding to a bit value of "0", and the voltage of the node Q2 may be a logic-high voltage corresponding to a bit value of "1".

Referring to FIG. 12B, a bit data value to be stored in the first latch L1 and the second latch L2 corresponding to the states E' and PV1' to PV3' to which the memory cells belong are shown as a table. That is, the voltage of the node $Q1_N$ of the first latch L1 indicates the LSB, and the voltage of the node $Q2_N$ of the second latch L2 indicates the MSB.

With respect to each of the first to m-th page buffers PB1 to PBm, the first and second reset control signals RST1 and RST2 and the first and second set control signals SET1 and SET2 may be appropriately applied to store the original data received from the controller 200 or the test device.

First, an unmasked sensing result is stored in the sensing latch LS of each page buffer. For example, a threshold voltage sensing operation on the memory cells MCi1 to MCim may be performed by applying the first voltage V1 shown in FIG. 11A to a word line connected to the selected page PGs.

For example, since the threshold voltage of the first memory cell MCi1 corresponding to the column ① is greater than the first voltage V1, the voltage of the node $QS_N$ of the sensing latch LS of the first page buffer PB1 connected to the first bit line BL1 may be the logic-low voltage corresponding to the bit value of "0", and the voltage of the node QS may be the logic-high voltage corresponding to the bit value of "1".

Meanwhile, since the threshold voltage of the second memory cell MCi2 corresponding to the column ② is less than the first voltage V1, the voltage of the node $QS_N$ of the sensing latch LS of the second page buffer PB2 connected to the second bit line BL2 may be the logic-high voltage corresponding to the bit value of "1", and the voltage of the node QS may be the logic-low voltage corresponding to the bit value of "0".

Through this, sensing data in which the target state is not masked is stored in the sensing latch LS of the first to m-th page buffers PB1 to PBm.

Thereafter, a value of the sensing latch LS in each page buffer is transmitted to the sense out node SO for masking of the target state. The fifteenth transistor T15 included in each page buffer is turned on to transmit the voltage of the node QS to the sense out node SO. When the voltage of the sense out node SO is logic-high as a result of the transmission, this means that the voltage of the node $QS_N$ is logic-low, and thus the threshold voltage of the memory cell is greater than the first voltage V1. Conversely, when the voltage of the sense out node SO is logic-low, this means that the voltage of the node $QS_N$ is logic-high, and thus the threshold voltage of the memory cell is less than the first voltage V1.

In a state in which the value of the sensing latch LS is transmitted to the sense out node SO, masking of the target state may be performed. It is assumed that the target state is the first program state PV1'. In this case, the value of the sense out node SO of the page buffer corresponding to the erase state E', the second program state PV2', and the third program state PV3' is required to be removed. Meanwhile, the value of the sense out node SO of the page buffer corresponding to the first program state PV1' is required to be maintained.

To this end, the first transmission control signal $TRAN_A$ and the fourth transmission control signal $TRAN_D$ are activated, and the second and third transmission control signals $TRAN_B$ and $TRAN_C$ are deactivated. Accordingly, the fourth transistor T4 and the twelfth transistor T12 in all page buffers are turned on, and the sixth transistor T6 and the tenth transistor T10 are turned off.

In a case of the first page buffer, as described above, the voltage of the node $Q1_N$ may be the logic-high voltage, and the voltage of the node Q1 may be the logic-low voltage. Meanwhile, the voltage of the node $Q2_N$ may be the logic-low voltage, and the voltage of the node Q2 may be the logic-high voltage. Accordingly, the third transistor T3 and the eleventh transistor T11 are turned off, and the fifth transistor T5 and the ninth transistor T9 are turned on. Accordingly, all paths between the sense out node SO and the ground node maintain a block state, and thus the voltage of the sense out node SO is maintained.

Meanwhile, in a case of the second page buffer, the original data stored in the memory cell corresponding to the column ② is "1 1". Therefore, the voltage of the node $Q1_N$ may be the logic-high voltage, and the voltage of the node Q1 may be the logic-low voltage. Meanwhile, the voltage of the node $Q2_N$ may be the logic-high voltage, and the voltage of the node Q2 may be the logic-low voltage. Accordingly, the third transistor T3 and the ninth transistor T9 are turned off, and the fifth transistor T5 and the eleventh transistor T11 are turned on. Since the fourth transmission control signal $TRAN_D$ is activated and the twelfth transistor T12 is turned on, the sense out node SO of the second page buffer is electrically connected to the ground node. Therefore, regardless of the value stored in the sensing latch LS of the second page buffer, the voltage of the sense out node SO becomes the logic low voltage indicating 0.

When comparing the first page buffer and the second page buffer, the first page buffer stores the LSB and MSB data corresponding to the first program state PV1' in the first and second latches L1 and L2, respectively. Therefore, the sense out node SO is not connected to the ground node, by a combination of the first to fourth transmission control signals $TRAN_A$ to $TRAN_D$ masking the first program state PV1'. Accordingly, the voltage of the sense out node SO is maintained.

On the other hand, the second page buffer stores the LSB and MSB data corresponding to the erase state E' in the first and second latches L1 and L2, respectively. Therefore, the eleventh and twelfth transistors T11 and T12 are turned on and the sense out node SO is connected to the ground node, by the combination of the first to fourth transmission control signals $TRAN_A$ to $TRAN_D$ masking the first program state PV1'. Accordingly, regardless of the value stored in the sensing latch LS of the second page buffer, the voltage of the sense out node SO becomes the logic low voltage indicating 0.

By analogy to the above description, in a case of the third page buffer, since the LSB and MSB data corresponding to the second program state PV2' are stored in the first and second latches L1 and L2, respectively, the third and fourth transistors T3 and T4 may be turned on and the sense out node SO may be connected to the ground node, by the combination of the first to fourth transmission control signals $TRAN_A$ to $TRAN_D$ masking the first program state PV1'.

In addition, in a case of the fourth page buffer, since the LSB and MSB data corresponding to the third program state PV3' are stored in the first and second latches L1 and L2, respectively, the third and fourth transistors T3 and T4 and the eleventh and twelfth transistors T11 and T12 may be turned on and the sense out node SO may be connected to the ground node, by the combination of the first to fourth transmission control signals $TRAN_A$ to $TRAN_D$ masking the first program state PV1'.

In summary, the combination of the first to fourth transmission control signals $TRAN_A$ to $TRAN_D$ masking the first program state PV1' maintains the voltage of the sense out node SO of the page buffer connected to the memory cells corresponding to the first program state PV1'. On the other hand, combination of the first to fourth transmission control signals $TRAN_A$ to $TRAN_D$ masking the first program state PV1' connects the sense out node SO of the page buffer connected to the memory cells corresponding to the erase state E', the second program state PV2', and the third program state PV3' to the ground node. Accordingly, the sensing result corresponding to the erase state E', the second program state PV2', and the third program state PV3' are removed.

In a state in which masking for the first program state PV1' is performed, the number of page buffers in which the voltage of the sense out node SO is a logic high voltage state among the first to m-th page buffers PB1 to PBm is counted. More specifically, bit data corresponding to the voltage of the sense out node SO may be stored in the sensing latch LS, and masked bit data may be counted among the bit data of the sensing latch LS included in the plurality of page buffers. Accordingly, among memory cells having a threshold voltage greater than the read voltage used in the sensing operation, the number of memory cells belonging to the first program state PV1' may be counted.

Although not shown in FIG. 12A, such a counting operation may be performed by an arbitrary counting circuit. A count result may be transmitted to the controller 200. Through this, among the sensing results using the first voltage V1, the sensing result of only the memory cells corresponding to the first program state PV1' may be extracted.

The above description relates to a case where the target state is the first program state PV1'. Masking is possible identically also in a case where the target state is the erase state E', the second program state PV2', or the third program state PV3'. Referring to FIG. 12C, the combination of the first to fourth transmission control signals $TRAN_A$ to $TRAN_D$ applied to each of the erase state E', the first program state PV1', the second program state PV2', and the third program state PV3' is shown as a table. For example, when the target state is the erase state E', the first and third transmission control signals $TRAN_A$ and $TRAN_C$ are activated with a turn-on voltage, and the second and fourth transmission control signals $TRAN_B$ and $TRAN_D$ maintain deactivation with a turn-off voltage.

When the target state is the second program state PV2', the second and fourth transmission control signals $TRAN_B$ and $TRAN_D$ are activated with the turn-on voltage, and the first and third transmission control signals $TRAN_A$ and $TRAN_C$ maintain deactivation with the turn-off voltage.

When the target state is the third program state PV3', the second and third transmission control signals $TRAN_B$ and $TRAN_C$ are activated with the turn-on voltage, and the first and fourth transmission control signals $TRAN_A$ and $TRAN_D$ maintain deactivation with the turn-off voltage.

Figure 13A:
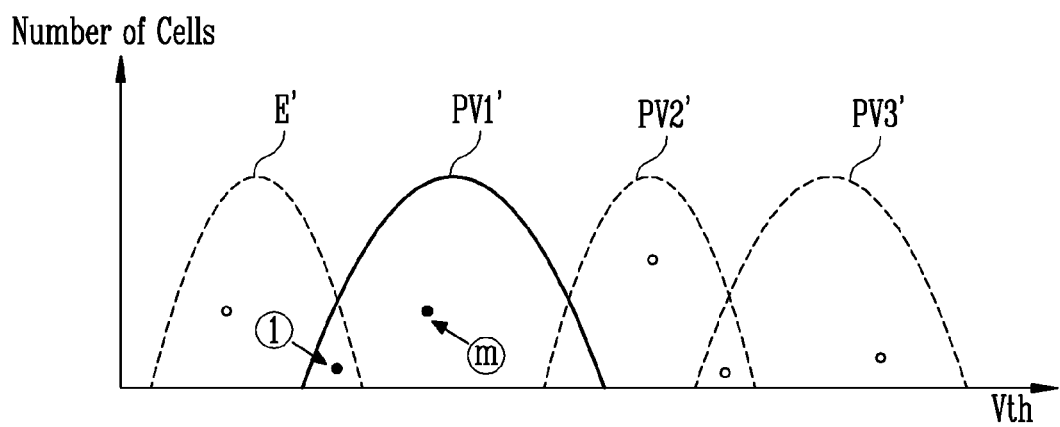
FIG. 13A is a graph illustrating the threshold voltage distribution of the memory cells detected in a state in which the first program state PV1' is masked as a target state.
Figure 13B:
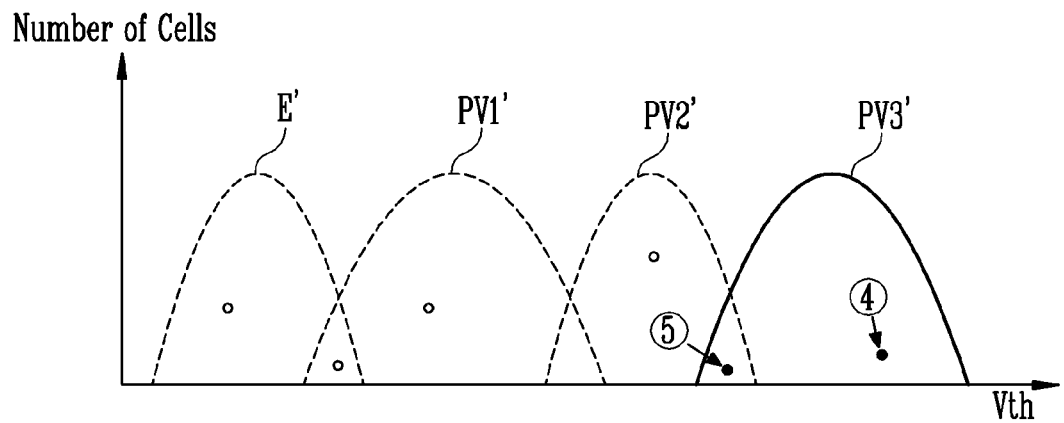
FIG. 13B is a graph illustrating the threshold voltage distribution of the memory cells detected in a state in which the third program state PV3' is masked as a target state.

FIG. 13A is a graph illustrating the threshold voltage distribution of the memory cells detected in a state in which the first program state PV1' is masked as a target state. FIG. 13B is a graph illustrating the threshold voltage distribution of the memory cells detected in a state in which the third program state PV3' is masked as a target state.

Referring to FIG. 13A, the threshold voltage distribution of the memory cells detected in a state in which the first program state PV1' is masked as a target state is shown. As described above, when the first program state PV1' is masked as a target state, only a threshold voltage distribution result of the memory cells corresponding to the first program state PV1' may be detected, except for a threshold voltage sensing result of the memory cells corresponding to the erase state E' and the second and third program states PV2' and PV3'.

Referring to FIG. 13B, the threshold voltage distribution of the memory cells detected in a state in which the third program state PV3' is masked as a target state is shown. As described above, when the third program state PV3' is masked as a target state, only a threshold voltage distribution result of the memory cells corresponding to the third program state PV3' may be detected, except for a threshold voltage sensing result of the memory cells corresponding to the erase state E' and the first and second program states PV1' and PV2'.

FIG. 14 is a flowchart illustrating a method of operating a semiconductor memory device according to an embodiment of the present disclosure.

Referring to FIG. 14, the method of operating the semiconductor memory device according to an embodiment of the present disclosure includes selecting a target state in which a threshold voltage distribution is to be detected (S110), determining a plurality of read voltages for dividing a voltage range in which a threshold voltage of the selected target state is distributed (S130), and performing a plurality of sensing operations using the plurality of read voltages on the selected page (S150).

In step S110, the target state to be extracted through masking may be selected. The target state may be selected internally in the semiconductor memory device 100 or may be selected by a command received from the controller 200 or the test device. For example, as described with reference to FIGS. 11A to 13A, the first program state PV1' may be selected as the target state. However, in step S110, any one of the erase state E', the second or third program states PV2' or PV3 may be selected as the target state.

In step S130, first, the voltage range in which the threshold voltage is distributed may be determined, and the plurality of read voltages for dividing the determined voltage range may be determined. As described with reference to FIG. 11A, when the target state is the first program state P1', the voltage range may be first determined, and the P voltages V1 to VP for dividing the voltage range may be determined as the plurality of read voltages.

In step S150, the plurality of sensing operations based on the determined voltages V1 to VP are performed. When the number of determined read voltages is P, the sensing operation may also be performed P times.

FIG. 15 is a flowchart illustrating an example of an embodiment of step S150 of FIG. 14. More specifically, FIG. 15 is a flowchart illustrating one sensing operation among the P sensing operations performed in step S150 of FIG. 14. Meanwhile, each of the steps of FIG. 15 may be performed by the page buffer shown in FIG. 12A.

Referring to FIG. 15, the sensing operation performed in step S150 of FIG. 14 includes storing the MSB and LSB data stored in each of the memory cells in the first and second latches included in each of the plurality of page buffers (S210), performing the threshold voltage sensing operation of the memory cells included in the selected page using the selected read voltage and storing the bit data generated as a result of sensing in the sensing latch included in each of the plurality of page buffers (S230), transmitting the bit data stored in the sensing latch to the sense out node of a corresponding page buffer (S250), performing a masking operation of the target state for the bit data, by applying a control signal corresponding to the target state to the plurality of page buffers (S270), and outputting the bit data masked to the target state (S290).

In step S210, the MSB and LSB data stored in each of the memory cells are stored in the first latch L1 and the second latch L2 of the corresponding page buffer. For example, in the example of FIGS. 9A, 9B, 11A, and 11B described above, in a case of the column ① corresponding to the first memory cell MCi1, the LSB is 1 and the MSB is 0. Therefore, in step S210, the bit data of 1 may be stored in the first latch L1 of the page buffer corresponding to the column ①, and the bit data of 0 may be stored in the second latch L2.

In step S230, the result of the sensing operation using the selected read voltage is stored in the sensing latch of each page buffer. For example, the threshold voltage sensing operation on the memory cells MCi1 to MCim may be performed by applying the first voltage V1 shown in FIG. 11A to the word line connected to the selected page PGs. At this time, since the threshold voltage of the first memory cell MCi1 corresponding to the column ① is greater than the first voltage V1, the voltage of the node $QS_N$ of the sensing latch LS of the first page buffer PB1 connected to the first bit line BL1 may become the logic-low voltage corresponding to the bit value of "0". Accordingly, the voltage of the node QS becomes the logic-high voltage corresponding to the bit value of "1".

In step S250, the bit data stored in the sensing latch is transmitted to the sense out node SO of the corresponding page buffer. More specifically, a voltage value corresponding to the bit data stored in the sensing latch LS may be transmitted to the sense out node SO. In an example of FIG. 12A, the voltage of the node QS may be transmitted to the sense out node SO by turning on the fifteenth transistor T15 included in each page buffer. When the voltage of the sense out node SO is logic-high as a result of performing step S250, this means that the threshold voltage of the memory cell is greater than the first voltage V1 because the voltage of the node $QS_N$ is logic-low. Conversely, when the voltage of the sense out node SO is logic-low, this means that the threshold voltage of the memory cell is less than the first voltage V1 because the voltage of the node $QS_N$ is logic-high.

In step S270, a control signal corresponding to the target state is applied to the plurality of page buffers to perform the masking operation of the target state for the bit data. That is, the bit data corresponding to remaining states other than the target state is removed.

For example, when the target state is the first program state PV1', the first transmission control signal $TRAN_A$ and the fourth transmission control signal $TRAN_D$ may be activated, and the second and third transmission control signals $TRAN_B$ and $TRAN_C$ may be deactivated. Accordingly, the voltage of the sense out node SO of the page buffer in which the bit data stored in the first and second latches L1 and L2 are "1" and "0" is maintained, and the sense out node SO of the other page buffer is discharged.

When the target state is the erase state E', the first and third transmission control signals $TRAN_A$ and $TRAN_C$ may be activated with the turn-on voltage, and the second and fourth transmission control signals $TRAN_B$ and $TRAN_D$ may be deactivated with the turn-off voltage. When the target state is the second program state PV2', the second and fourth transmission control signals $TRAN_B$ and $TRAN_D$ may be activated with the turn-on voltage, and the first and third transmission control signals $TRAN_A$ and $TRAN_C$ may be deactivated with the turn-off voltage. When the target state is the third program state PV3', the second and third transmission control signals $TRAN_B$ and $TRAN_C$ may be activated with the turn-on voltage, and the first and fourth transmission control signals $TRAN_A$ and $TRAN_D$ may be deactivated with the turn-off voltage.

In step S290, the bit data masked to the target state may be output. More specifically, the bit data corresponding to the voltage of the sense out node SO may be stored in the sensing latch LS, and the masked bit data may be counted among the bit data of the sensing latch LS included in the plurality of page buffers. The count result may be transmitted to the controller 200.

Figure 16:
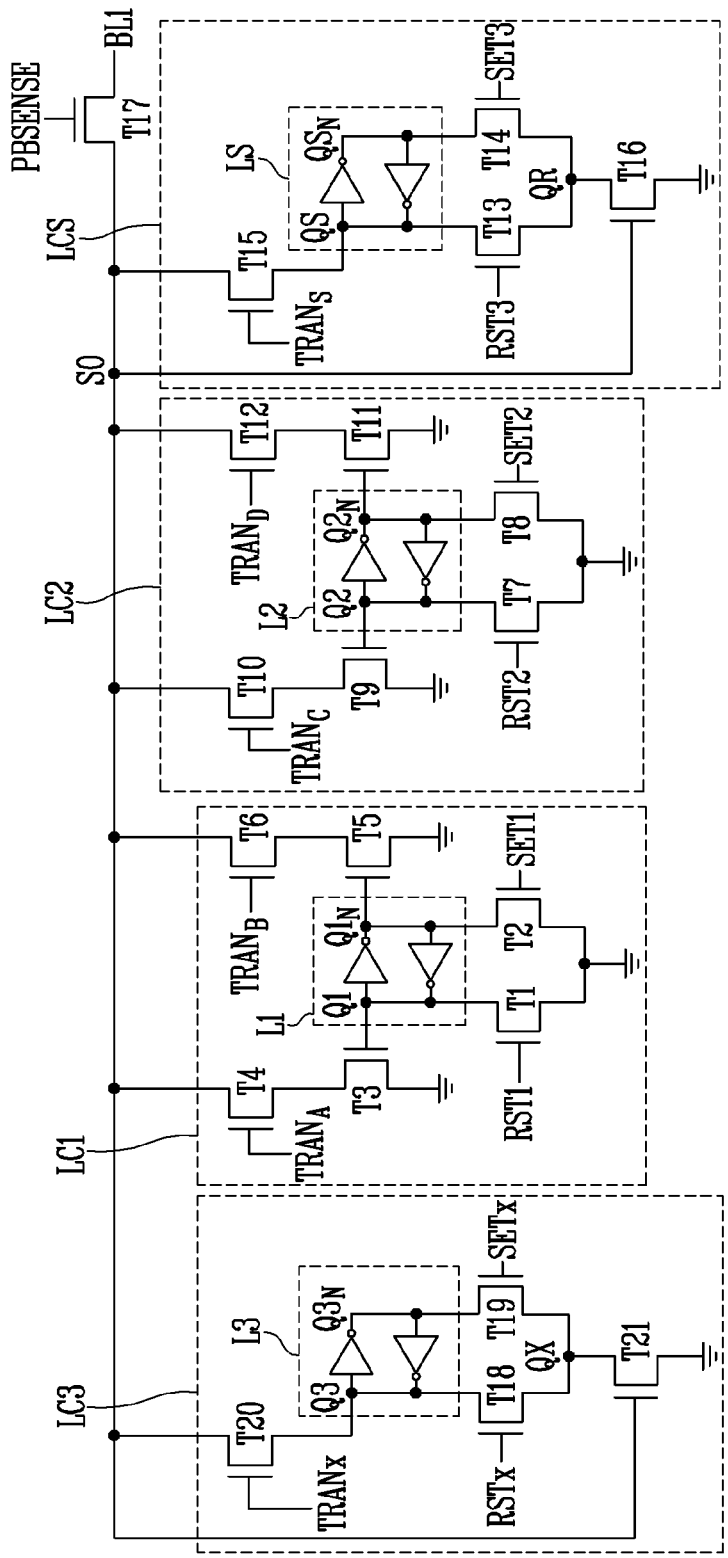
FIG. 16 is a circuit diagram illustrating a page buffer capable of detecting the threshold voltage distribution of the MLCs by masking for each target state, according to another embodiment of the present disclosure.

FIG. 16 is a circuit diagram illustrating a page buffer capable of detecting the threshold voltage distribution of the MLCs by masking for each target state, according to another embodiment of the present disclosure.

Referring to FIG. 16, a circuit diagram of an example of a page buffer apart from that of FIG. 12A is shown. The first to m-th page buffers PB1 to PBm shown in FIG. 2 may be implemented as a circuit shown in FIG. 16. The first to m-th page buffers PB1 to PBm shown in FIG. 2 may further include other components in addition to the circuit shown in FIG. 16. Hereinafter, a description is given based on the page buffer PB1 connected to the first bit line BL1.

Similarly to FIG. 12A, the page buffer shown in FIG. 16 may include a first latch circuit LC1, a second latch circuit LC2, and a sensing latch circuit LCS. The first latch circuit LC1 may include a first latch L1 and first to sixth transistors T1 to T6. The second latch circuit LC2 may include a second latch L2 and seventh to twelfth transistors T7 to T12. The sensing latch circuit LCS may include a sensing latch LS and thirteenth to sixteenth transistors T13 to T16. The first latch circuit LC1, the second latch circuit LC2, and the sensing latch circuit LCS may be connected to a sense out node SO. Meanwhile, the page buffer may further include a seventeenth transistor T17 connected between the sense out node SO and the bit line BL1. The seventeenth transistor T17 may be controlled by a page buffer sensing signal PBSENSE.

Meanwhile, the page buffer of FIG. 16 may further include a third latch circuit LC3 in addition to the first latch circuit LC1, the second latch circuit LC2, and the sensing latch circuit LCS. The third latch circuit LC3 may include a third latch L3 and eighteenth to twenty-first transistors T18 to T21. The third latch L3 may be referred to as a "cache latch". Referring to the third latch circuit LC3, the eighteenth transistor T18 is connected between a node Q3 of the third latch L3 and a node OX, and the nineteenth transistor T19 is connected between a node $Q3_N$ of the third latch L3 and the node OX. The eighteenth transistor T18 is controlled by a reset signal RSTx, and the nineteenth transistor T19 is controlled by a set signal SETx. Meanwhile, the twentieth transistor T20 is connected between the node Q3 and the sense out node SO. The twentieth transistor T20 is controlled by a transmission control signal TRANx. In addition, the twenty-first transistor T21 is connected between the node QX and the ground node. The twenty-first transistor T21 is controlled by a voltage of the sense out node SO. The third latch circuit LC3 may be used to temporarily store the sensing result masked to the target state after the sensing operation by the first voltage V1. Meanwhile, the third latch circuit LC3 may perform an XOR operation on the result of sensing operation by the second voltage V2 masked to the target state, and bit data stored in the third latch circuit LC3. And then the third latch circuit LC3 may store the result of the XOR operation.

An operation of the page buffer shown in FIG. 16 is described later with reference to FIGS. 17 and 18A to 18D.

FIG. 17 is a flowchart illustrating another example of an embodiment of step S150 of FIG. 14. More specifically, FIG. 17 is a flowchart illustrating two sensing operations among the P sensing operations performed in step S150 of FIG. 14. Meanwhile, each of the steps of FIG. 17 may be performed by the page buffer shown in FIG. 16.

FIGS. 18A to 18D are graphs illustrating a method of counting the memory cells having the threshold voltage between the first read voltage and the second read voltage by masking the memory cells to the target state according to the method shown in FIG. 17.

Hereinafter, the operation of the page buffer shown in FIG. 16 is described with reference to FIGS. 17 and 18A to 18D together.

Referring to FIG. 17, the sensing operation performed in step S150 of FIG. 14 includes storing the MSB and LSB data stored in each of the memory cells in the first and second latches included in each of the plurality of page buffers (S300), performing the threshold voltage sensing operation of the memory cells included in the selected page using the first read voltage and storing first bit data generated as a result of sensing in the sensing latch included in each of the plurality of page buffers (S310), transmitting the first bit data stored in the sensing latch to the sense out node of a corresponding page buffer (S320), generating first target bit data from the first bit data by applying a control signal corresponding to the target state to the plurality of page buffers (S330), storing the first target bit data of the sense out node in each of the plurality of cache latches, by applying a first control signal to the plurality of cache latches (S340), performing the threshold voltage sensing operation of the memory cells included in the selected page using the second read voltage and storing second bit data generated as a result of sensing in the sensing latch included in each of the plurality of page buffers (S350), transmitting the second bit data stored in the sensing latch to the sense out node of a corresponding page buffer (S360), generating second target bit data from the second bit data by applying the control signal corresponding to the target state to the plurality of page buffers (S370), and storing XOR operation data for the first target bit data and the second target bit data in each of the plurality of cache latches, by applying a second control signal to the plurality of cache latches (S380), and detecting the number of memory cells of the target state having the threshold voltage between the first read voltage and the second read voltage, by counting the number of bits of "1" stored in the plurality of cache latches (S390).

Figure 18A:
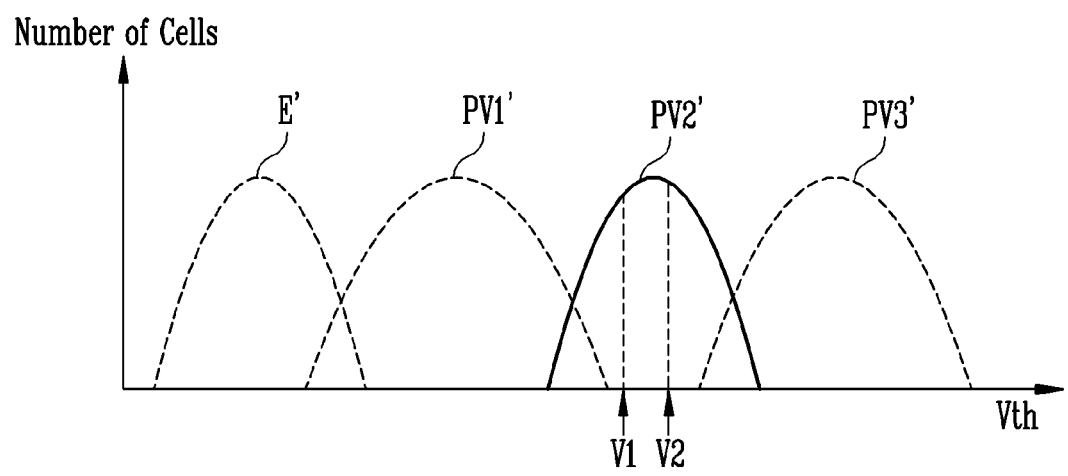
FIGS. 18A, 18B, 18C, and 18D are graphs illustrating a method of counting memory cells having a threshold voltage between a first read voltage and a second read voltage by masking the memory cells to the target state according to the method shown in FIG. 17.

Referring to FIG. 18A, a state in which the target state is the second program state PV2' is shown. Hereinafter, a case where the target state is the second program state PV2' is described as an example. That is, a method of counting the number of memory cells belonging to the second program state PV2' among the memory cells having the threshold voltage between the first read voltage V1 and the second read voltage V2 is described as an example.

In step S300, the MSB and LSB data stored in each of the memory cells are stored in the first latch L1 and the second latch L2 of the corresponding page buffer. For example, in the example of FIGS. 9A, 9B, 11A, and 11B described above, in a case of the column ①corresponding to the first memory cell MCi1, the LSB is 1 and the MSB is 0. Therefore, in step S300, the bit data of 1 may be stored in the first latch L1 of the page buffer corresponding to the column ①, and the bit data of 0 may be stored in the second latch L2. Step S300 may be performed substantially the same as step S210 of FIG. 15.

In step S310, the result of the sensing operation using the first read voltage is stored in the sensing latch of each page buffer. For example, the threshold voltage sensing operation on the memory cells MCi1 to MCim may be performed by applying the first voltage V1 shown in FIG. 18A to the word line connected to the selected page PGs. Step S310 of FIG. 17 may be performed substantially the same as step S230 of FIG. 15.

In step S320, the first bit data stored in the sensing latch is transmitted to the sense out node SO of the corresponding page buffer. More specifically, a voltage value corresponding to the first bit data stored in the sensing latch LS may be transmitted to the sense out node SO. In an example of FIG. 16, the voltage of the node QS may be transmitted to the sense out node SO by turning on the fifteenth transistor T15 included in each page buffer. When the voltage of the sense out node SO is logic-high as a result of performing step S320, this means that the threshold voltage of the memory cell is greater than the first voltage V1 because the voltage of the node $QS_N$ is logic-low. Conversely, when the voltage of the sense out node SO is logic-low, this means that the threshold voltage of the memory cell is less than the first voltage V1 because the voltage of the node $QS_N$ is logic-high.

In step S330, the first target bit data is generated from the first bit data, by applying the control signal corresponding to the target state to the plurality of page buffers. The first target bit data may be generated by performing a masking operation of the target state on the first bit data. That is, bit data corresponding to the remaining states other than the target state is removed.

Since the target state is the second program state PV2', the second and fourth transmission control signals $TRAN_B$ and $TRAN_D$ may be activated with the turn-on voltage, and the first and third transmission control signals $TRAN_A$ and $TRAN_C$ may be deactivated with the turn-off voltage in FIG. 16. Accordingly, among the sense out nodes SO having a logic-high voltage, the voltage of the sense out node SO of the page buffer corresponding to the second program state PV2' is maintained, and the voltage of the sense out node SO of the page buffer corresponding to other states E', PV1', and PV3' is discharged.

As step S330 is performed, only the sense out node SO of the page buffer corresponding to the second program state PV2' has a logic-high state among the page buffers connected to the memory cells having the threshold voltage greater than the first voltage V1. That is, only the sense out node SO of the page buffer shown in memory cells of a hatched area shown in FIG. 18B has the logic-high state. The first target bit data is data obtained by masking the first bit data to the second program state PV2'.

In step S340, the first target bit data of the sense out node is stored in each of the plurality of cache latches, by applying the first control signal to the plurality of cache latches. The "cache latch" shown in FIG. 17 may mean the third latch L3 shown in FIG. 16.

Specifically, in a state in which the third latch L3 of FIG. 16 is initialized (a state in which the voltage of the node Q3 is logic high and the voltage of the node $Q3_N$ is logic low), the eighteenth transistor T18 is turned on by activating the reset signal RSTx of the third latch circuit LC3. In this case, since when the voltage of the sense out node SO is logic high, the twenty-first transistor T21 is also turned on, the node Q3 is connected to the ground node. Accordingly, the voltage of the node Q3 is changed to a logic low, and the voltage of the node $Q3_N$ is changed to a logic high.

On the other hand, when the voltage of the sense out node SO is a logic low, the twenty-first transistor T21 is turned off, and thus the third latch L3 maintains an initial state even though the reset signal $RST_X$ is activated.

Accordingly, the first bit data masked to the second program state PV2', that is, the first target bit data, is stored in the cache latch, that is, the third latch L3. That is, the third latch L3 of the page buffer corresponding to the memory cells corresponding to the hatched area shown in FIG. 18B stores the bit of "1" and the third latch L3 of the page buffer corresponding to the remaining memory cells stores the bit of "0".

Thereafter, in step S350, the result of the sensing operation using the second read voltage is stored in the sensing latch of each page buffer. For example, the threshold voltage sensing operation on the memory cells MCi1 to MCim may be performed, by applying the second voltage V2 shown in FIG. 18A to the word line connected to the selected page PGs. Step S350 may be performed similarly to step S310.

In step S360, the second bit data stored in the sensing latch is transmitted to the sense out node SO of the corresponding page buffer. More specifically, a voltage value corresponding to the second bit data stored in the sensing latch LS may be transmitted to the sense out node SO. In the example of FIG. 16, the voltage of the node QS may be transmitted to the sense out node SO by turning on the fifteenth transistor T15 included in each page buffer. When the voltage of the sense out node SO is logic-high as a result of performing step S360, this means that the threshold voltage of the memory cell is greater than the second voltage V2 because the voltage of the node $QS_N$ is logic-low. Conversely, when the voltage of the sense out node SO is logic-low, this means that the threshold voltage of the memory cell is less than the second voltage V2 because the voltage of the node $QS_N$ is logic-high.

In step S370, the second target bit data is generated from the second bit data, by applying the control signal corresponding to the target state to the plurality of page buffers. The second target bit data may be generated by performing the masking operation of the target state on the second bit data. That is, the bit data corresponding to the remaining states other than the target state is removed.

Since the target state is the second program state PV2', the second and fourth transmission control signals $TRAN_B$ and $TRAN_D$ may be activated with the turn-on voltage, and the first and third transmission control signals $TRAN_A$ and $TRAN_C$ may be deactivated with the turn-off voltage in FIG. 16. Accordingly, among the sense out nodes SO having the logic-high voltage, the voltage of the sense out node SO of the page buffer corresponding to the second program state PV2' is maintained, and the voltage of the sense out node SO of the page buffer corresponding to other states E', PV1', and PV3' is discharged.

As step S370 is performed, only the sense out node SO of the page buffer corresponding to the second program state PV2' has the logic-high state among the page buffers connected to the memory cells having the threshold voltage greater than the second voltage V2. That is, only the sense out node SO of the page buffer shown in memory cells of a hatched area shown in FIG. 18C has the logic-high state. The second target bit data is data obtained by masking the second bit data to the second program state PV2'.

In step S380, XOR operation data for the first target bit data and the second target bit data is stored in each of the plurality of cache latches, by applying the second control signal to the plurality of cache latches. As described above, the "cache latch" shown in FIG. 17 may mean the third latch L3 shown in FIG. 16.

Specifically, in a state in which the first target bit data is stored in the third latch L3 of FIG. 16, the nineteenth transistor T19 is turned on by activating the set signal SETx of the third latch circuit LC3. In this case, since when the voltage of the sense out node SO is logic high, the twenty-first transistor T21 is also turned on, the node $Q3_N$ is connected to the ground node. Accordingly, the voltage of the node $Q3_N$ is changed to a logic low, and the voltage of the node Q3 is changed to a logic high.

On the other hand, when the voltage of the sense out node SO is a logic low, the twenty-first transistor T21 is turned off, and thus the third latch L3 maintains the state in which the first target bit data is stored even though the set signal $SET_X$ is activated.

Figure 18B:
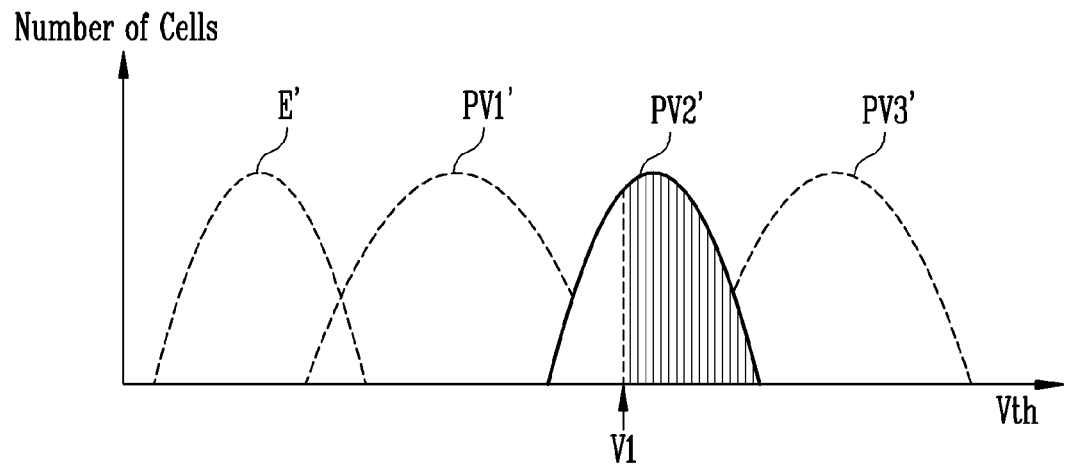
Figure 18C:
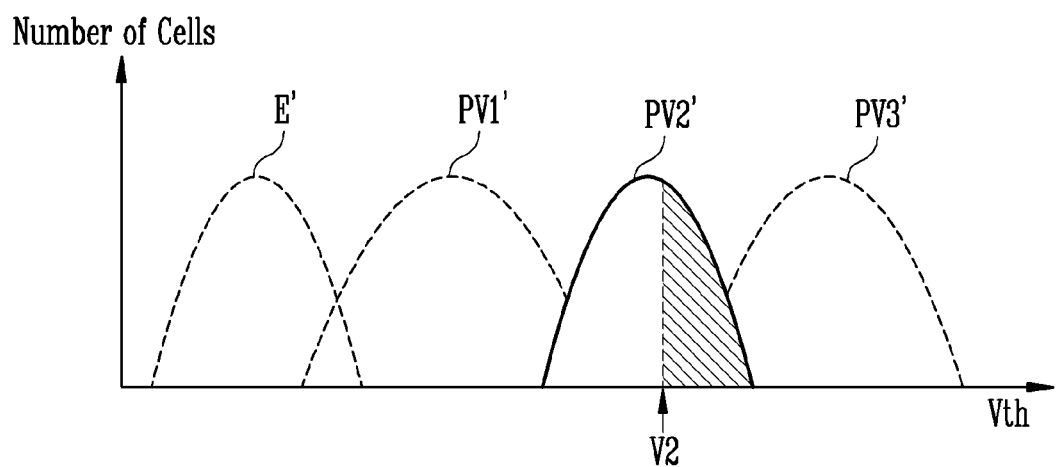
Figure 18D:
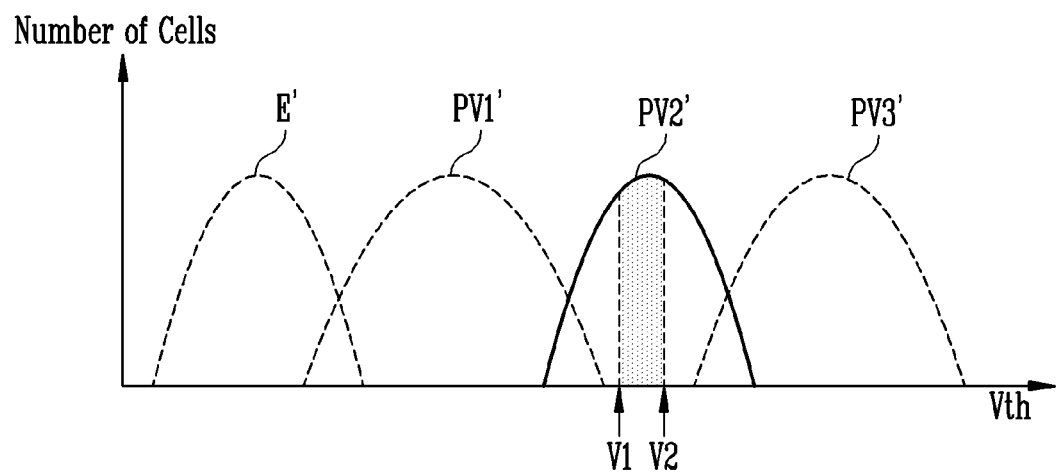

That is, the voltage of the node $Q3_N$ of the third latch L3 of the page buffer connected to the memory cells corresponding to the hatched area of FIG. 18C among the third latches L3 of the page buffer connected to the memory cells corresponding to the hatched area of FIG. 18B is changed from the logic high to the logic low. In conclusion, as step S380 is performed, only the third latch L3 corresponding to the memory cells corresponding to the hatched area of FIG. 18D stores the bit of "1", and the third latch L3 corresponding to the remaining memory cells stores the bit of "0".

As step S380 is performed, the bit data finally stored in the cache latch becomes a result of the XOR operation of the first target bit data and the second target bit data.

Thereafter, in step S390, the number of bits of "1" among the bits stored in the plurality of cache latches may be counted. Accordingly, the number of memory cells corresponding to the shaded portion shown in FIG. 18D may be counted. The count result may be transmitted to the controller 200.

Figure 19:
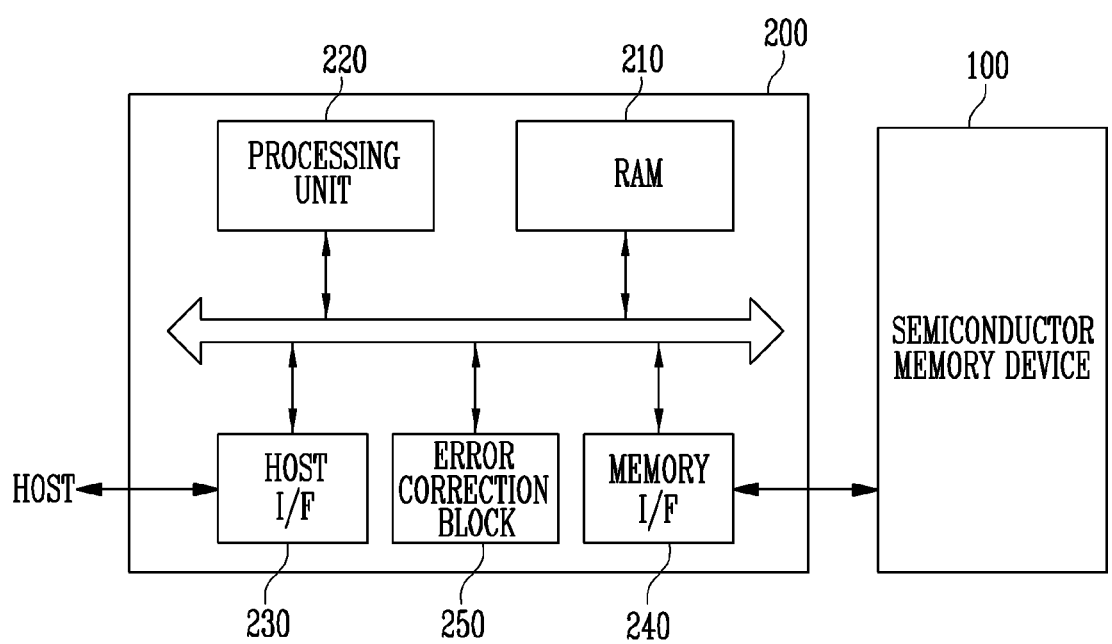
FIG. 19 is a block diagram illustrating an example of the controller shown in FIG. 1.

FIG. 19 is a block diagram illustrating an example of the controller shown in FIG. 1.

Referring to FIG. 19, the controller 200 is connected to the semiconductor memory device 100 and a host HOST. The semiconductor memory device 100 may be the semiconductor memory device described with reference to FIG. 2.

The controller 200 is configured to access the semiconductor memory device 100 in response to a request from the host HOST. For example, the controller 200 is configured to control read, write, erase, and background operations of the semiconductor memory device 100. The controller 200 is configured to provide an interface between the semiconductor memory device 100 and the host HOST. The controller 200 is configured to drive firmware for controlling the semiconductor memory device 100.

The controller 200 includes a random access memory (RAM) 210, a processing unit 220, a host interface 230, a memory interface 240, and an error correction block 250. The RAM 210 is used as at least one of an operation memory of the processing unit 220, a cache memory between the semiconductor memory device 100 and the host HOST, and a buffer memory between the semiconductor memory device 100 and the host HOST.

The processing unit 220 controls an overall operation of the controller 200.

The host interface 230 includes a protocol for performing data exchange between the host HOST and the controller 200. As an example of an embodiment, the controller 200 is configured to communicate with the host HOST through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial ATA protocol, a parallel ATA protocol, a small computer system interface (SCSI) protocol, an enhanced small disk interface (ESDI) protocol, an integrated drive electronics (IDE) protocol, and a private protocol.

The memory interface 240 interfaces with the semiconductor memory device 100. For example, the memory interface 240 includes a NAND interface or a NOR interface.

The error correction block 250 is configured to detect and correct an error of data received from the semiconductor memory device 100 using an error correcting code (ECC). The processing unit 220 may control the semiconductor memory device 100 to adjust a read voltage and perform re-read according to an error detection result of the error correction block 250.

The controller 200 and the semiconductor memory device 100 may be integrated into one semiconductor device. As an example of an embodiment, the controller 200 and the semiconductor memory device 100 may be integrated into one semiconductor device to form a memory card. For example, the controller 200 and the semiconductor memory device 100 may be integrated into one semiconductor device to form a memory card such as a PC card (personal computer memory card international association (PCMCIA)), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 200 and the semiconductor memory device 100 may be integrated into one semiconductor device to form a semiconductor drive (solid state drive (SSD)). The semiconductor drive (SSD) includes the memory system 1000 configured to store data in a semiconductor memory. When the memory system 1000 including the controller 200 and the semiconductor memory device 100 is used as the semiconductor drive (SSD), an operation speed of the host connected to the memory system 1000 is dramatically improved.

As another example, the memory system 1000 including the controller 200 and the semiconductor memory device 100 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, and a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an example of an embodiment, the semiconductor memory device 100 and the memory system including the same may be mounted as a package of various types. For example, the semiconductor memory device 100 or the memory system may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline integrated circuit package (SOIC), a shrink small outline package (SSOP), a thin small outline package (TSOP), a system in package (SIP), a multi-chip package (MCP), a wafer-level fabricated package (WFP), or a wafer-level processed stack package (WSP).

Figure 20:
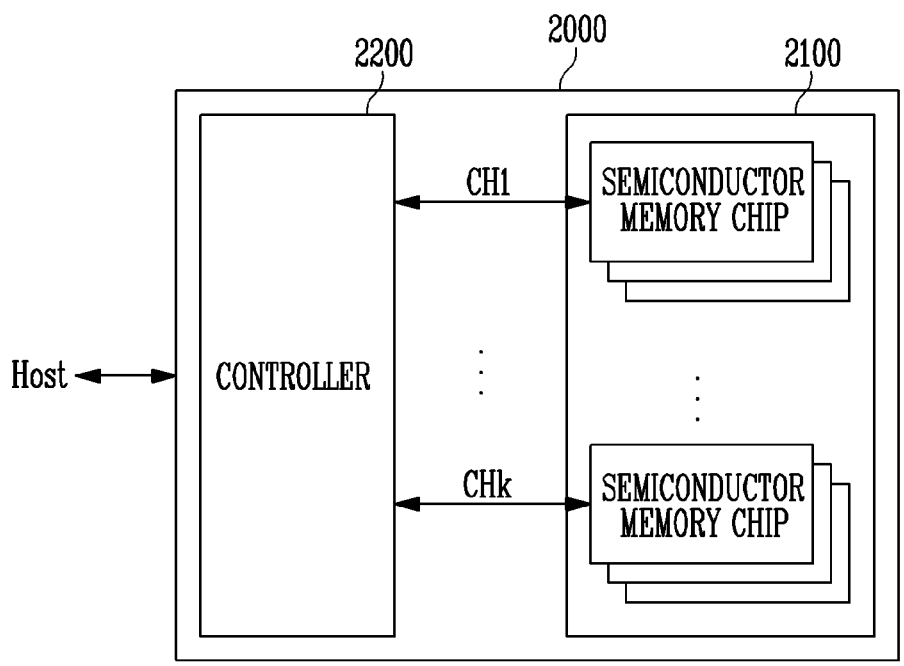
FIG. 20 is a block diagram illustrating an application example of the memory system of FIG. 19.

FIG. 20 is a block diagram illustrating an application example of the memory system of FIG. 19.

Referring to FIG. 20, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 20, the plurality of groups communicate with the controller 2200 through first to k-th channels CH1 to CHk, respectively. Each semiconductor memory chip is configured and is operated similarly to that of the semiconductor memory device 100 described with reference to FIG. 2.

Each group is configured to communicate with the controller 2200 through one common channel. The controller 2200 is configured similarly to the controller 200 described with reference to FIG. 19 and is configured to control the plurality of memory chips of the semiconductor memory device 2100 through the plurality of channels CH1 to CHk.

Figure 21:
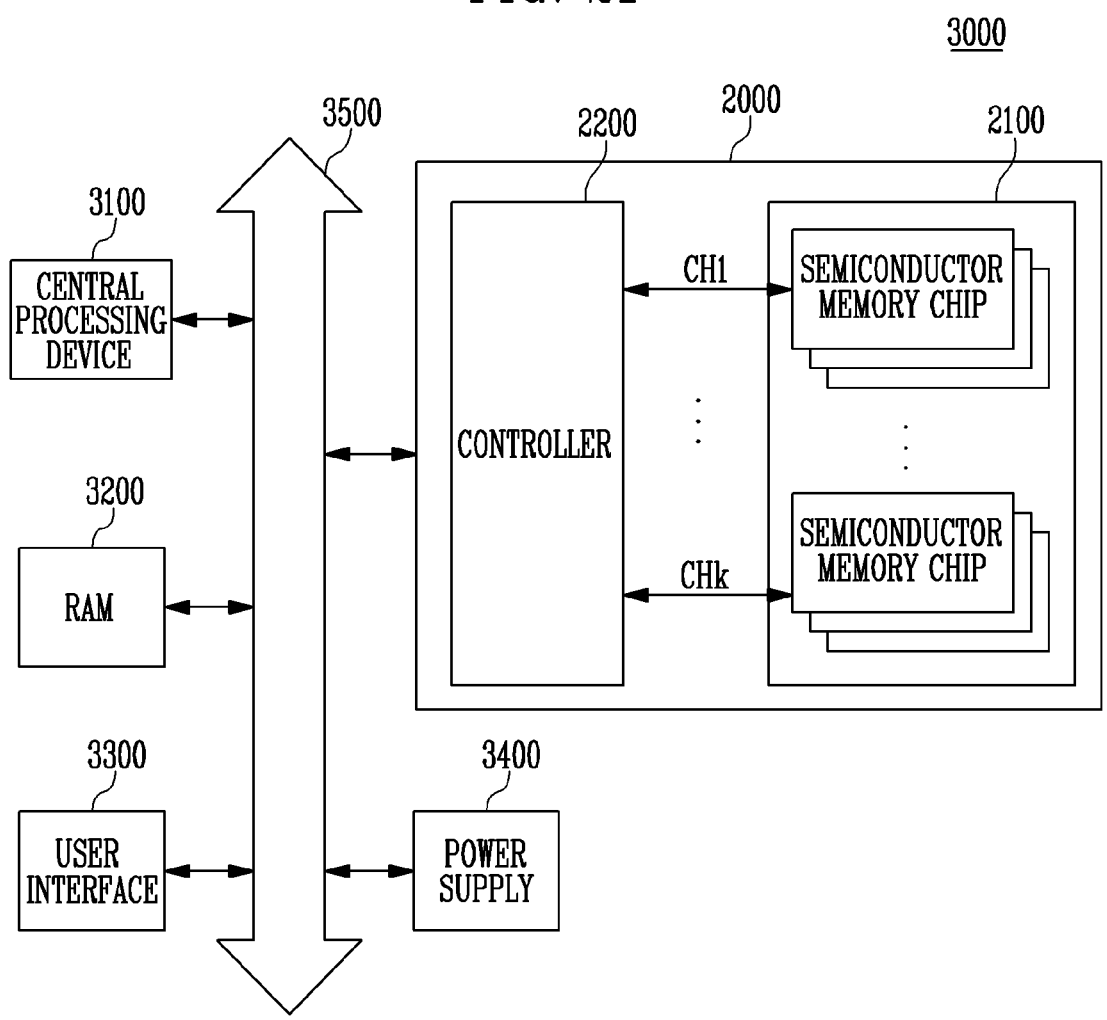
FIG. 21 is a block diagram illustrating a computing system including the memory system described with reference to FIG. 20.

FIG. 21 is a block diagram illustrating a computing system including the memory system described with reference to FIG. 20.

The computing system 3000 includes a central processing device 3100, a random access memory (RAM) 3200, a user interface 3300, a power supply 3400, a system bus 3500, and the memory system 2000.

The memory system 2000 is electrically connected to the central processing device 3100, the RAM 3200, the user interface 3300, and the power supply 3400 through the system bus 3500. Data provided through the user interface 3300 or processed by the central processing device 3100 is stored in the memory system 2000.

In FIG. 21, the semiconductor memory device 2100 is connected to the system bus 3500 through the controller 2200.

However, the semiconductor memory device 2100 may be configured to be directly connected to the system bus 3500. At this time, a function of the controller 2200 is performed by the central processing device 3100 and the RAM 3200.

In FIG. 21, the memory system 2000 described with reference to FIG. 20 is provided. However, the memory system 2000 may be replaced with the memory system 1000 including the controller 200 and the semiconductor memory device 100 described with reference to FIG. 19.

The embodiments of the present disclosure disclosed in the present specification and drawings are merely provided with specific examples to describe the technical content of the present disclosure and to help understanding of the present disclosure, and are not intended to limit the scope of the present disclosure.

What is claimed is:

1. A method of operating a semiconductor memory device detecting a threshold voltage distribution for memory cells included in a page selected from among a plurality of memory cells, wherein each of the plurality of memory cells stores N bit of data, the method comprising:
   selecting a target state, in which the threshold voltage distribution is to be detected, from among an erase state and first to (2N-1)-th program states, wherein N is a natural number;
   determining a plurality of read voltages for dividing a voltage range in which a threshold voltage of the selected target state is distributed; and
   performing a plurality of sensing operations using the plurality of read voltages on the selected page,
   wherein masking to the target state is applied in each of the plurality of sensing operations.

2. The method of claim 1, wherein performing the plurality of sensing operations using the plurality of read voltages on the selected page comprises:
   storing data stored in the memory cells included in the selected page in a data latch of a corresponding page buffer, respectively;
   performing a threshold voltage sensing operation of the memory cells included in the selected page using a selected read voltage among the plurality of read voltages, and storing bit data generated as a result of sensing in a sensing latch included in each of a plurality of page buffers;
   transmitting the bit data stored in the sensing latch to a corresponding sense out node; and
   removing a sensing result corresponding to remaining states except for the target state by applying a control signal corresponding to the target state to the plurality of page buffers.

3. The method of claim 2, wherein in removing the sensing result corresponding to the remaining states except for the target state by applying the control signal corresponding to the target state to the plurality of page buffers, a voltage of a sense out node of a page buffer storing bit data corresponding to the target state is maintained by the control signal corresponding to the target state.

4. The method of claim 2, wherein in removing the sensing result corresponding to the remaining states except for the target state by applying the control signal corresponding to the target state to the plurality of page buffers, a sense out node of a page buffer storing bit data corresponding to the remaining states except for the target state is connected to a ground node by the control signal corresponding to the target state.

5. The method of claim 2, further comprising:
   outputting bit data masked to the target state.

6. The method of claim 1, wherein performing the plurality of sensing operations using the plurality of read voltages on the selected page comprises:
   storing data stored in the memory cells included in the selected page in a data latch of a corresponding page buffer, respectively;
   performing a threshold voltage sensing operation of the memory cells included in the selected page using a first read voltage, and storing first bit data generated as a result of sensing in a sensing latch included in a corresponding page buffer, respectively;
   transmitting the first bit data stored in the sensing latch to a corresponding sense out node;
   generating first target bit data from the first bit data by applying a control signal corresponding to the target state to a plurality of page buffers;
   storing the first target bit data in a cache latch included in a corresponding page buffer, respectively;
   performing the threshold voltage sensing operation of the memory cells included in the selected page using a second read voltage, and storing second bit data generated as a result of sensing in a sensing latch included in a corresponding page buffer;
   transmitting the second bit data stored in the sensing latch to a corresponding sense out node;
   generating second target bit data from the second bit data by applying the control signal corresponding to the target state to the plurality of page buffers; and
   storing a result of an exclusive OR (XOR) operation on the first target bit data and the second target bit data stored in the cache latch, in the cache latch.

7. The method of claim 6, wherein in generating the first target bit data from the first bit data by applying the control signal corresponding to the target state to the plurality of page buffers, a voltage of a sense out node of a page buffer storing bit data corresponding to the target state in the data latch is maintained by the control signal corresponding to the target state.

8. The method of claim 6, wherein in generating the first target bit data from the first bit data by applying the control signal corresponding to the target state to the plurality of page buffers, a sense out node of a page buffer storing bit data corresponding to remaining states except for the target state in the data latch is connected to a ground node by the control signal corresponding to the target state.

9. The method of claim 6, further comprising:
detecting the number of memory cells having a threshold voltage between the first read voltage and the second read voltage, among the memory cells belonging to the target state, based on data stored in the cache latch.

10. A semiconductor memory device comprising:
a plurality of memory cells connected to a selected word line;
a plurality of page buffers configured to perform a sensing operation on each of the plurality of memory cells, wherein each of the plurality of memory cells stores N bit of data; and
control logic configured to control an operation of the plurality of page buffers,
wherein each of the plurality of page buffers comprises:
at least one data latch connected to a sense out node and storing bit data; and
a sensing latch connected to the sense out node and storing bit data indicating whether a threshold voltage of a corresponding memory cell among the plurality of memory cells is greater than a selected read voltage during a sensing operation,
the at least one data latch stores bit data programmed to the corresponding memory cell, and
the control logic selects a target state, in which a threshold voltage distribution is to be detected, from among an erase state and first to (2N-1)-th program states, wherein N is a natural number, and controls each of the plurality of page buffers to apply masking of the target state to the bit data stored in the sensing latch, based on the bit data stored in the at least one data latch.

11. The semiconductor memory device of claim 10, wherein in order to apply the masking of the target state, the control logic controls each of the plurality of page buffers to transmit a voltage corresponding to the bit data generated based on the selected read voltage to the sense out node, and controls each of the plurality of page buffers so that a voltage of the sense out node of a page buffer storing bit data corresponding to the target state is maintained and the sense out node of the page buffer storing bit data corresponding to remaining states except for the target state is connected to a ground node.

12. The semiconductor memory device of claim 11, wherein the control logic controls each of the plurality of page buffers to respectively store target bit data generated as a result of masking to the target state in a corresponding sensing latch.

13. The semiconductor memory device of claim 10, wherein each of the plurality of page buffers further comprises a cache latch connected to the sense out node, and the control logic performs a sensing operation on each of the plurality of memory cells using a first read voltage, stores first bit data generated as a result of the sensing operation in a corresponding sensing latch, generates first target bit data by applying masking of the target state to the first bit data, stores the first target bit data in corresponding cache latches, respectively, performs a sensing operation on each of the plurality of memory cells using a second read voltage different from the first read voltage, stores second bit data generated as a result of the sensing operation in a corresponding sensing latch, generates second target bit data by applying masking of the target state to the second bit data, and controls each of the plurality of page buffers to respectively store a result of an exclusive OR (XOR) operation on the first target bit data and the second target bit data in the cache latch.

14. The semiconductor memory device of claim 13, further comprising:
a counting circuit configured to count the number of memory cells having a threshold voltage between the first read voltage and the second read voltage among memory cells belonging to the target state, based on data stored in the cache latch.

15. The semiconductor memory device of claim 10, wherein each of the page buffers further comprises a page buffer sensing transistor connected between a bit line connected to a corresponding memory cell and the sense out node.

* * * * *